United States Patent [19]
Tani

[11] Patent Number: 5,303,810
[45] Date of Patent: Apr. 19, 1994

[54] MAGAZINE RACK AND POSITIONAL ADJUSTMENT SYSTEM THEREFOR

[75] Inventor: Okie Tani, Tokyo, Japan

[73] Assignee: Tani Electronics Industry Co., Ltd., Tokyo, Japan

[21] Appl. No.: 5,390

[22] Filed: Jan. 15, 1993

[30] Foreign Application Priority Data

Jan. 18, 1992 [JP] Japan .............................. 4-010040[U]
Mar. 21, 1992 [JP] Japan .............................. 4-028934[U]

[51] Int. Cl.$^5$ .............................................. B65G 47/00
[52] U.S. Cl. ............. 198/345.3; 198/465.1; 198/465.3; 198/473.1; 198/803.11; 29/33 P
[58] Field of Search ............... 198/345.3, 465.1, 465.3, 198/473.1, 803.01, 803.2, 803.11; 29/33 P

[56] References Cited

U.S. PATENT DOCUMENTS

| | | | |
|---|---|---|---|
| 3,010,371 | 11/1961 | Riedel et al. ...................... | 198/345.3 |
| 4,302,919 | 12/1981 | Hartness ........................... | 198/345.3 |
| 4,371,075 | 2/1983 | Erlichman ......................... | 198/345.3 |
| 4,485,911 | 12/1984 | Cameron .......................... | 198/345.3 |
| 4,799,586 | 1/1989 | Kutzli et al. ...................... | 198/345.3 |
| 5,060,780 | 10/1991 | Santandrea et al. ............. | 198/803.01 |

FOREIGN PATENT DOCUMENTS 4-10040  1/1992  Japan .
4-23637  2/1992  Japan .
4-78179  7/1992  Japan .
4-125486 11/1992  Japan .

*Primary Examiner*—Joseph E. Valenza
*Attorney, Agent, or Firm*—Foley & Lardner

[57] ABSTRACT

A magazine rack and adjustment/transport system therefore includes a conveyer line for introducing magazine racks into a production process. As a new magazine rack is introduced to the line, a positional adjustment means is active to position the magazine rack on the conveyer. In addition, the alignment of the magazine rack on the conveyer may be adjusted and a present accommodating width or the magazine rack may be detected and compared with an accommodating width required by a process being carried out on the conveyer. If the detected accommodating width of the magazine rack is other than the required accommodating width, the rack may automatically be adjusted by an adjustment mechanism prior to being added to the conveyer or at a predetermined position on the conveyer.

87 Claims, 26 Drawing Sheets

MAGAZINE RACK AND POSITIONAL ADJUSTMENT SYSTEM THEREFOR

BACKGROUND OF THE INVENTION

1. Field of the Invention

The present invention relates generally to a magazine rack system utilized in assembly or processing of flat articles such as printed circuit boards or the like. Specifically to a magazine rack system for such articles in which a size of a portion for holding an individual article as well as a positional alignment of the magazine rack on a transport system, such as a chain conveyer, may be automatically adjusted.

2. Description of the Related Art

Various types of magazine rack systems having width adjustability for handling flat articles during assembly or processing have been proposed. Most commonly, a system in which force is applied directly to a movable plate which determines the accommodating width of the rack, and thereby the movable plate is moved to a desired width. In order to secure the movable plate at the desired width during subsequent use of the rack, a fixing mechanism, such as a screw fastening mechanism or the like is employed. In attempting to implement automatic control of such a rack as described above, an overall size of the rack, movable plate, fixing mechanism and control assembly becomes large and unwieldy rendering the assembled magazine rack uneconomical, complex and generally impractical.

On the other hand, automatically controlled magazine racks have been proposed, for example in Japanese Utility Model Application Nos. 64421-1990, 120272-1990 and 41244-1991, in which it is possible to easily and correctly move the movable side plate to control the accommodating width by applying rotational motive power thereto in one point fashion. However, according to the construction of these types of magazine racks, fine adjustment of rack size after the movable plate has been moved to the vicinity of a target position is extremely difficult, often necessitating that one worker hold a workpiece or measure for gauging size while a second worker performs fine adjustment of width control manually. Thus a considerable number of steps are necessary for rack adjustment operations.

In addition, when racks must be changed frequently during work operations, such as a part mounting line or the like, such adjustment must be performed repeatedly each time a rack is changed, consuming man hours and raising production expenses while reducing efficiency.

Also, in the above-described type of rack, as in the previously described rack, implementing automatic control causes an overall size and complexity thereof to become large and unwieldy rendering the magazine rack uneconomical, and impractical.

Further, according to widespread implementation of factory automation (FA) and computer integrated manufacturing (CIM), it is desirable to mount such a magazine rack as described above to a moving conveyer, such as a chain conveyer system.

When utilizing such a conveyer system for a specific production process, a spacing and alignment of the magazine rack in relation to the conveyer, as well as in relation to other magazine racks on the conveyer line is necessary. This operation may be effected by temporarily holding the magazine rack at an adjustment position while lateral adjustment of the spacing of the rack and adjustment of the alignment of the rack position in relation to the conveyer line, is made. Japanese Utility Model Application No. 10040-1992 (one of the applications on which applicant's claim for foreign priority benefit is based) discloses one such example of an adjustable magazine rack with an automated system for carrying out rack adjustment, however, this system is bulky and full automation of all processes is not provided.

SUMMARY OF THE INVENTION

It is therefore a principal object of the present invention to overcome the drawbacks of the prior art.

It is a further object of the present invention to provide a automated, fully adjustable magazine rack system which can be implemented with a moving conveyer mechanism for effecting efficient factory automation.

It is also an object of the present invention to provide such an automated magazine rack system which is relatively simple in mechanism, economical of space and which may be constructed relatively inexpensively.

In order to accomplish the aforementioned and other objects, a magazine rack and positional adjustment system therefor is provided, comprising: an essentially box-shaped magazine rack having opposing side wall portions, a base portion and accommodating portions arranged at the inner side of the wall portions; a conveyer upon which the magazine rack is carried; a lateral positional adjustment mechanism including at least a pair of arm members, a space between the arm members being substantially equal to a width of the magazine rack, the arm members having plane surface portions on facing surfaces thereof and outwardly curved portions at distal ends thereof; and drive means drivable of the lateral positional adjustment mechanism in a direction toward the conveyer such that corners of the magazine rack, stopped by the conveyer at a predetermined position in front of the lateral positional adjustment mechanism, closest to the arm members contact the outwardly curved portions of the distal ends of the arm members, the drive means driving the arm members further in the direction of the conveyer until opposites sides of the magazine rack contact the plane surface portions of the arm members, the drive means then being operable to return the lateral positional adjustment mechanism to an initial state so as to be ready to perform adjustment operation for the next magazine rack on the conveyer.

According to another aspect of the present invention, a magazine rack and positional adjustment system is provided, comprising: an essentially box-shaped magazine rack having opposing side wall portions, a base portion and accommodating portions arranged at the inner side of the wall portions, the magazine rack additionally including, on at least two corners thereof, with support columns which are set at opposing corners on one side of the magazine rack such that front and rear faces of the support columns are defined at outer sides of at least two corners of the base portion of the magazine rack and accommodating width adjustment means comprising a movable unit provided at the base portion of the magazine rack, one of the side wall portions being movably mounted on the movable unit and transmission means for receiving an input rotation motive power in a one point manner and transmitting the input rotational motive power to a the movable unit of the accommodating width adjustment means; a conveyer upon which the magazine rack is carried the conveyer including an alignment rail on a side thereof proximate the lateral positional adjustment mechanism and at least in the vicinity of the lateral positional adjustment mechanism; a lateral positional adjustment mechanism including at least a pair of arm members, a space between the arm members being substantially equal to a width of the magazine rack, the arm members having plane surface portions on facing surfaces thereof and outwardly curved portions at distal ends thereof, the lateral positional adjustment mechanism being additionally provided on each arm thereof, with a conveyer alignment direction adjustment mechanism comprising a support column presser mounted on a pivot shaft and presser driving means therefore; drive means drivable of the lateral positional adjustment mechanism in a direction toward the conveyer such that corners of the magazine rack, stopped by the conveyer at a predetermined position in front of the lateral positional adjustment mechanism, closest to the arm members contact the outwardly curved portions of the distal ends of the arm members, the drive means driving the arm members further in the direction of the conveyer until opposites sides of the magazine rack contact the plane surface portions of the arm members, then the presser driving means being actuated thereby rotating the support column pressers inwardly so as to contact a rear face of the support columns, pushing the magazine rack such that the front faces of the support columns are pressed flush against an inner face the aligning rail of the conveyer suitably aligning the magazine rack on the conveyer the lateral positional adjustment mechanism then being operable in a reverse operation such that the support column pressers are retracted from contact with the support columns of the magazine rack and the arms are retracted away from the conveyer holding the magazine rack returned to an initial state so as to be ready to perform adjustment and alignment operations for a subsequent next magazine rack on the conveyer; and control means for automatically stopping the conveyer at the predetermined position and actuating the lateral positional adjustment mechanism and components thereof.

DESCRIPTION OF THE PREFERRED EMBODIMENT

Figure 1:
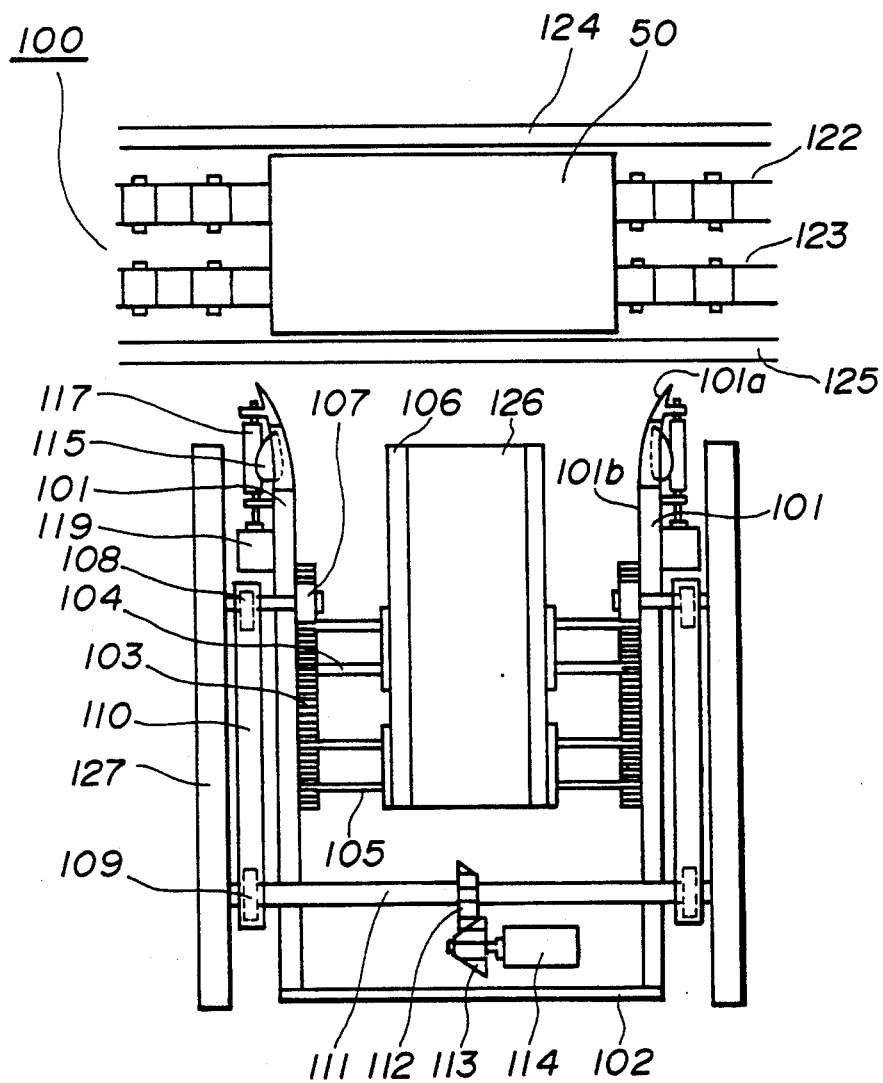
FIG. 1 is a perspective view of a major portion of the magazine rack.
Figure 2:
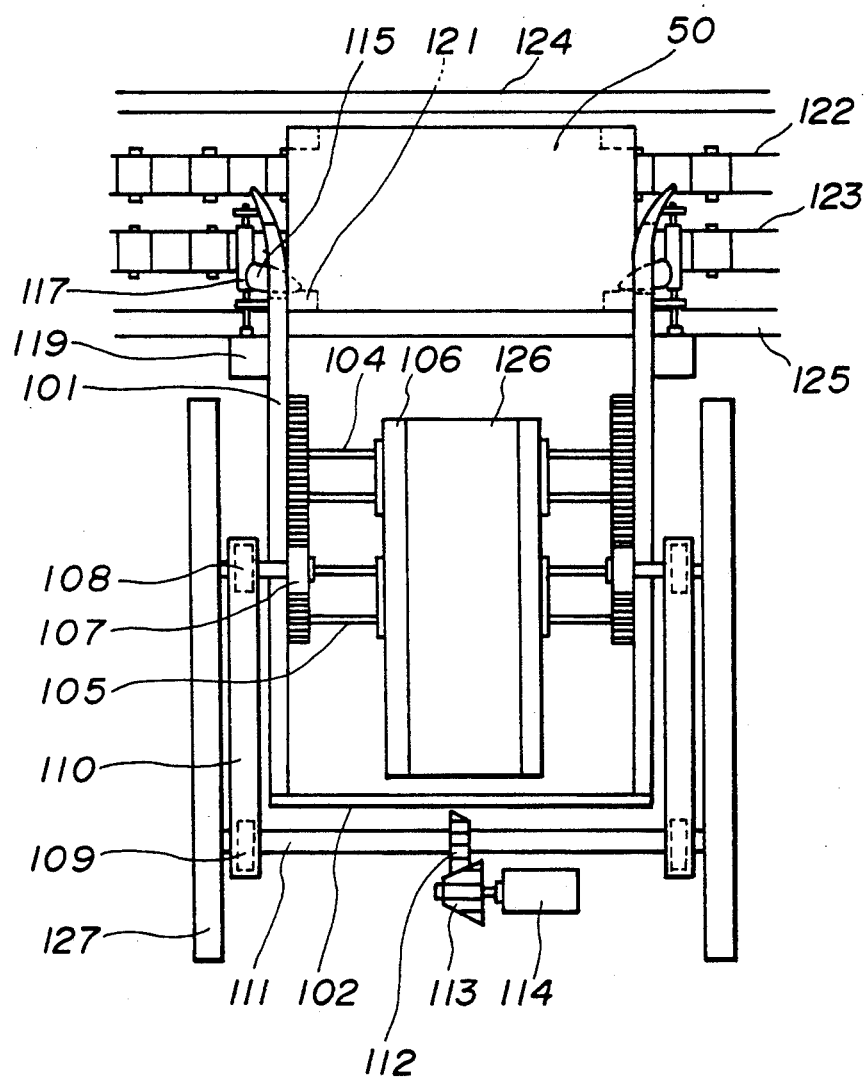
FIG. 2 is a cross-sectional view of a major portion of the magazine rack with relevant portions shown by phantom lines.
Figure 11:
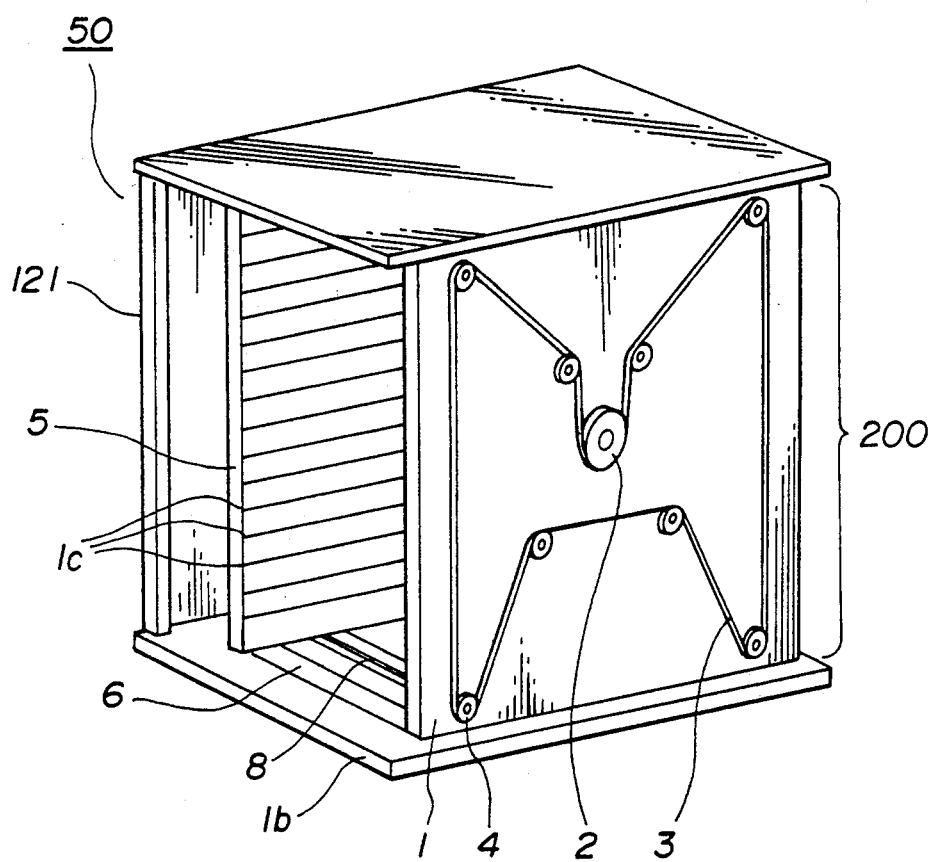
FIG. 11 is a perspective view of a magazine rack utilized by the system of the invention.

Referring now to the drawings, particularly to FIGS. 1 and 2, a first embodiment of a magazine rack and positional adjustment system therefor will be described in detail. First, an essentially box-shaped magazine rack 50, as seen in FIG. 11, may be utilized for holding articles such as substantially flat printed circuit boards (not shown) or the like. As seen in FIG. 11, the magazine rack 50 comprises side wall portions 1, movable plate 5, a base portion 1b and accommodating portions 1c arranged at the inner side of the wall portions 1 portion 1 and the movable plate 5 for holding articles to be placed in the rack according to a production or processing operation.

First, referring to FIG. 1, a lateral positional adjustment mechanism 100 of the first embodiment of the invention comprises arms 101, an arm connecting plate 102, rack gears 103, movable units 104 and 105, guide rails 106, pinion gears 107, timing belt gears 108 and 109 for timing belts 110, a drive shaft 111, a drive gear 112, a motor gear 113, an arm driving motor 114, a fixed portion 126 and a side plate 127.

It will be noted that, except for the arm connecting plate 102, the drive shaft 111, the drive gear 112, the motor gear 113, the arm driving motor 114, the fixed portion 126 and the side plate 127, the other of the above mentioned components are provided in pairs respectively.

As seen in FIG. 1, when a chain conveyer 99 conveys a magazine rack 50, via moving chains 122, 123, and the movement of the chains 122, 123 are halted at a predetermined position, the above described system is operable as follows; first, the arm driving motor 114 starts rotation and the rotational motive power from the motor is transmitted via the motor gear 113, the drive gear 112, the drive shaft 111, the timing belt gears 108, 109, the timing belt 110 and the pinion gear 107 to be finally transmitted to the rack gear 103 which is fixedly secured to the arm 101. The movable units 104 and 105 are provided between the arm 101 and the guide rail 106 which is fixedly secured to the fixed portion 126 so that when motive power is transmitted to the rack gear 103, the movable units 104, 105 are moved horizontally on the guide rail 106 and, at the same time, the arm 101 is moved horizontally toward the magazine rack 50.

As seen in FIG. 2, when the position of the magazine rack 50 on the chains 122 and 123 is not sufficiently close to the correct predetermined position to carry out mechanical adjustment of the magazine rack 50, the horizontal movement of the above-described arm 101 provides positional adjustment of the magazine rack 50 as will be described in detail hereinbelow.

When the arms 101 are moved horizontally, corners of the magazine rack 50 closest to the arms 101 contact curved faces 101a at the inner side of the ends of the arms 101. The arms continue horizontal movement in the direction of the magazine rack 50 until these corners of the magazine rack 50 come into contact with plane portions 101b of the inner side of the arms 101 and the magazine rack 50 is held between the arms 101 and correct lateral positioning of the magazine rack on the conveyer is effected. After this, the drive motor 114 is turned OFF and horizontal motion of the arms 101 is stopped.

Then, the lateral positional adjustment mechanism 100 is activated in the reverse of the above-described operations, such that the arms 101 are retracted away from the conveyer 99 holding the magazine rack 50. Thus the lateral positional adjustment mechanism 100 is returned to an initial state so as to be ready to perform adjustment operation for the next magazine rack 50 on the conveyer 99.

According to the above-described positioning operation the magazine rack 50 may be positioned at any predetermined position on a moving conveyer 99 according to a processing operation to be carried out utilizing the magazine rack 50. Further, correct spacing between a plurality of magazine racks 50 utilized in a processing operation may be reliably assured.

The above lateral positional adjusting mechanism 100 has been described in terms of the present embodiment of the invention and in accordance with the accompanying drawings, however it will be noted that various modifications may be effected which fall within the scope of the invention. For example, three or more arms 101 may be implemented in the lateral positional adjustment mechanism 100 so as to improve the accuracy of the positional adjustment operation.

Hereinbelow, a second embodiment of the present invention will be described, detail which has been previously described in relation to the previous embodiment will be omitted for brevity.

Figure 12:
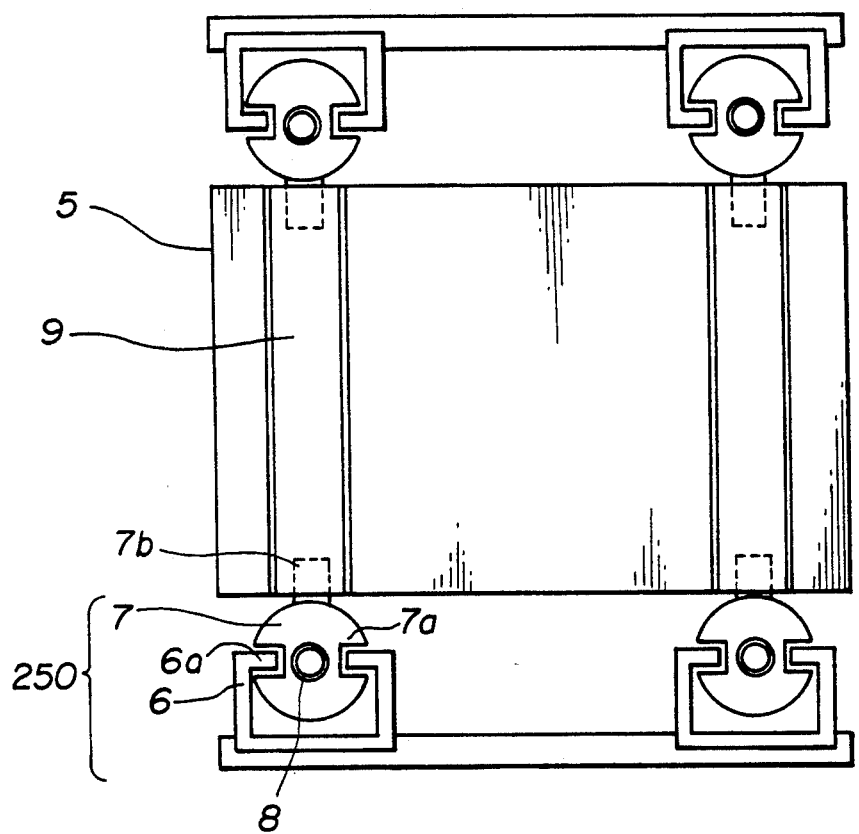
FIG. 12 is a cross-sectional view showing a accommodating width adjustment drive portion of the invention with a movable side wall portion mounted thereon.
Figure 13:
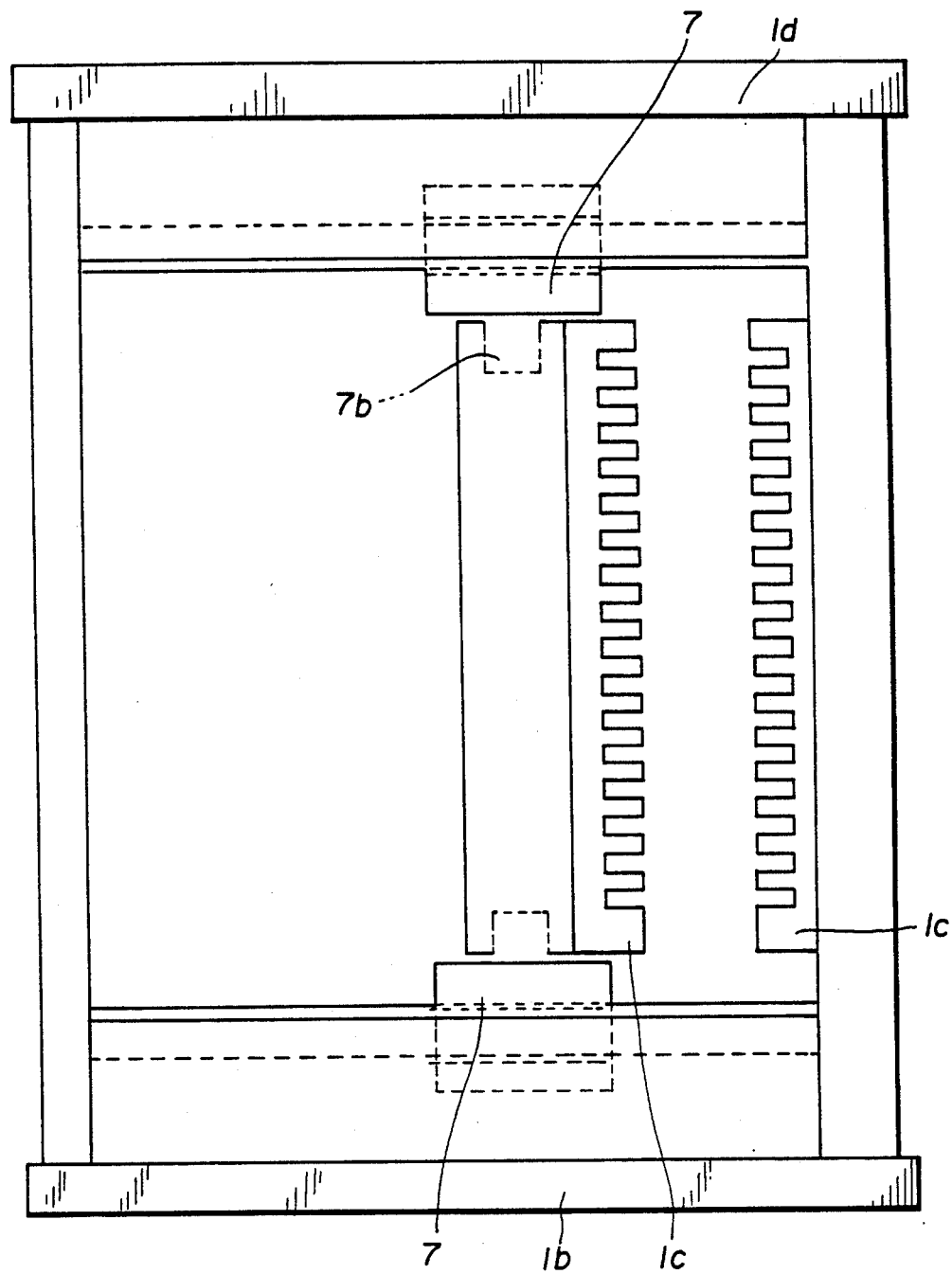
FIG. 13 is an explanatory diagram showing a front view of a magazine rack according to the invention, major components of the accommodating width adjustment drive portion being shown in phantom lines.

Referring again to FIG. 11, and also FIG. 12, a magazine rack 50 and associated mechanism as employed in the second embodiment is shown.

According to the second embodiment, the magazine rack 50 of the second embodiment is provided, on at least two corners thereof, with support columns 121 which are set at opposing corners on one side of the magazine rack 50 such that front and rear faces of the support columns are defined at outer sides of at least two corner portions of the base portion 1b of the magazine rack 50.

Figure 3:
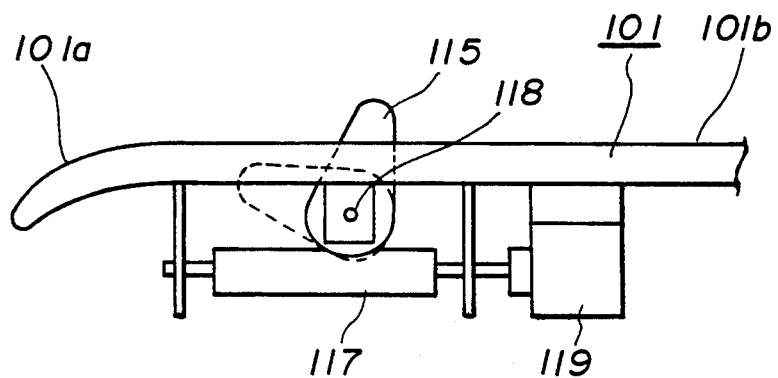
FIG. 3 is a plan view of a conveyer alignment mechanism mounted on a left side positional adjustment arm of the system of the invention.
Figure 4:
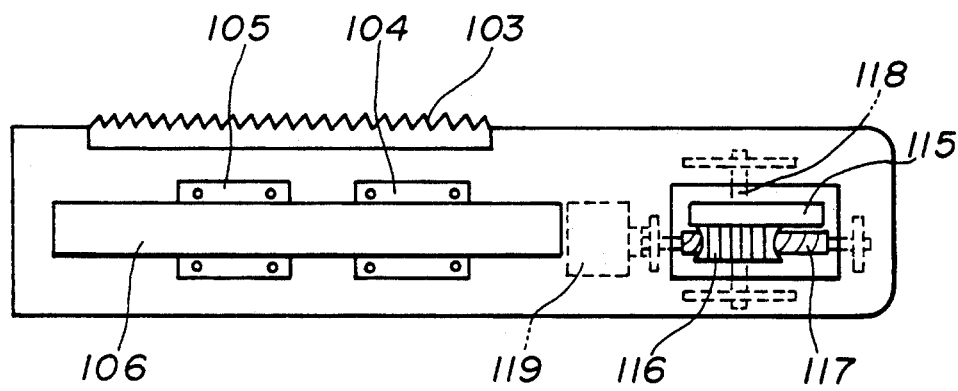
FIG. 4 is a side view of a right side positional adjustment arm according to a second embodiment of the system of the invention, including a conveyer alignment mechanism.

According to this embodiment, and as seen in FIGS. 3 and 4, the lateral positional adjustment mechanism 100 shown in the previous embodiment is additionally provided on each arm 101 thereof, with a conveyer alignment direction adjustment mechanism 150 comprising a support column presser 115, reduction gear 116, worm gear 117, pivot shaft 118 and a support column presser driving motor 119.

Referring to FIGS. 1-4, for assuring correct alignment of the laterally positioned magazine rack 50 on the conveyer 99 (that is, adjusting the rack vertically relative the top view shown in the drawings), each of the arms 101 are provided with an alignment mechanism operable as described hereinbelow.

Referring to FIGS. 2-4, when the lateral adjustment described above in reference to the first embodiment is complete, before the retraction step is initiated, support column presser driving motors 119, 119 installed on the outer face of each the arms 101, 101 are driven rotating worm gears 117, 117 in accordance therewith. Rotation of the worm gears 117, 117 is transmitted to reduction gears 116, 116 engaged therewith rotating the support column pressers 115, 115 inwardly to contact support columns 121, 121 provided at opposing corners of the magazine rack 50.

The support column pressers 115, 115 rotate so as to contact a rear face of the support columns 121, 121 facing away from the fixed portion 126 thus pushing the magazine rack 50 in the direction of the fixed portion 126 such that the front faces of the support columns 121, 121 are pressed flush against an inner face 125a of an aligning rail 125 of the conveyer 99, thus suitably aligning the magazine rack correctly on the conveyer 99. At this time, the support column presser driving motors 119, 119 are switched OFF. Then, the alignment and positioning mechanisms are activated in the reverse of the above-described operations, such that the support column pressers 115, 115 are retracted from contact with the support columns 121, 121 of the magazine rack 50 and the arms 101, 101 are retracted away from the conveyer 99 holding the magazine rack 50.

Thus the lateral positional adjustment mechanism 100 and the conveyer alignment direction adjusting mechanism 150 are returned to an initial state so as to be ready to perform adjustment and alignment operations for the next magazine rack 50 on the conveyer 99.

According to the above-described positioning and aligning operations, the magazine rack 50 may be positioned at any predetermined position on a moving conveyer 99 and aligned precisely for effecting a particular processing operation to be carried out utilizing the magazine rack 50. Further, as with the previous embodiment, correct spacing between a plurality of magazine racks 50 utilized in a processing operation may be reliably assured.

The above lateral positional adjustment mechanism 100 and the conveyer alignment direction adjusting mechanism 150 have been described in terms of the present embodiment of the invention and in accordance with the accompanying drawings, however it will be noted that various modifications may be effected fall within the scope of the invention.

Hereinbelow, a third embodiment of the present invention will be described, detail which has been previously described in relation to the previous embodiments will be omitted for brevity.

According to the third embodiment of a magazine rack 50 and positional adjustment system therefore, when the magazine rack 50 is held at the predetermined position on the conveyer 99 for positional adjustment thereof, an accommodating width of the magazine rack 50 may be effected. It will also be noted that adjustment of the accommodating width may alternatively be conducted at a position other than the predetermined position for positional adjustment, or that the magazine rack 50 may be adjusted for accommodating width prior to being introduced to the conveyer 99.

For purposes of adjustment, referring once again to FIG. 11, the magazine rack 50 of the present embodiment is provided with transmission means 200. comprising a large sprocket 2, which is positioned at a central portion of the wall portion 1 and plays a role as a driving portion to accept motive power from an external power source in a one-point manner. Rotation of the large sprocket 2 transmits the motive power via a ladder chain 3, small sprockets 4 mounted on threaded drive shafts 8, as seen in FIG. 12, and then to an accommodating width adjustment driving portion 250 comprising movable units 7 having grooved portions 7a thereof fitted to convex portions 6a of substantially C-shaped guide rails 6, as also shown in FIG. 12. To effect horizontal movement of the movable units 7 on the guide rails 6 according to rotation of the threaded drive shaft 8, contact between the threaded drive shaft 8 and the movable unit 7 is maintained in an engaged state by means of interengaging threads provided on the outer surface of the threaded drive shafts 8 and on the inner surface of an opening through the movable unit 7, through which the threaded drive shaft 8 passes, respectively.

Figure 18:
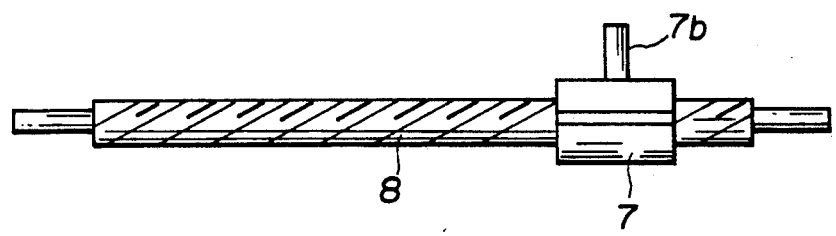
FIG. 18 is a side view of a modification of a movable unit and threaded drive shaft therefor of the magazine rack of the invention.
Figure 19:
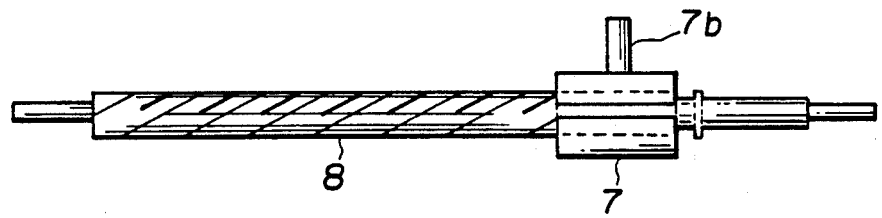
FIG. 19 is a side view of another modification of a movable unit and threaded drive shaft therefor for a magazine rack according to the invention.
Figure 20:
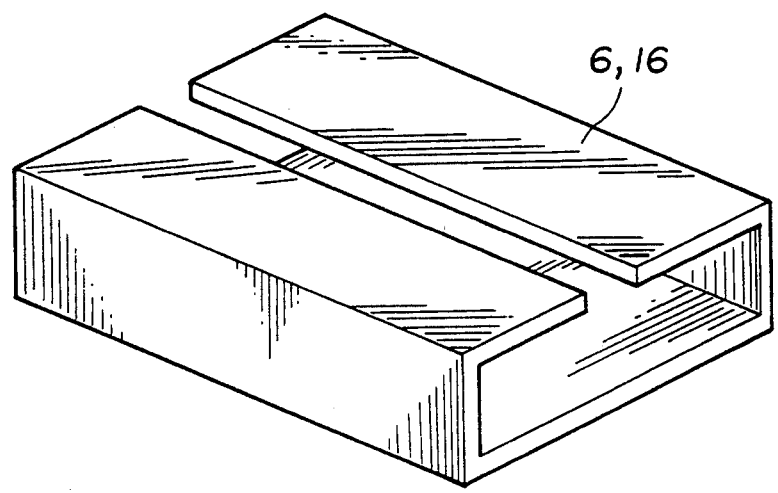
FIG. 20 is a perspective view of a guide rail utilized in the mechanism of an accommodating width adjustment drive portion of a magazine rack according to the invention.

The above may be appreciated referring to FIGS. 18 and 19, as seen in FIG. 19, the threaded drive shaft 8 may additionally be provided with a flange portion 8b for limiting the motion of the movable unit 7 on the threaded drive shaft 8.

In addition, as seen in FIG. 12, a projecting mounting peg 7b is formed to project upwardly from movable unit 7 at a central portion of the surface of the movable unit 7. The mounting peg 7b is inserted and fitted to the inside of a mounting column 9, so that a movable side plate 5, which is secured to one face of the mounting column 9, performs horizontal movement while according to the horizontal movement of the movable units 7 on the guide rails 6. According to this embodiment, accommodating portions 1c corresponding to accommodating portions 1c on the inner surface of the side wall 1 mounting the transmission means 200 are provided on the facing surface of the movable side plate 5. Thus, according to this embodiment, only one fixed side wall 1 having accommodation portions 1c is required.

Further, According to this construction, the movable side plate 5 becomes stopped and fixed when rotational movement of the large sprocket 2 is stopped.

Thus, for effecting adjustment of the accommodating width of the magazine rack 50, rotational motive power is introduced to the large sprocket 2. The rotational motive power is then transmitted via the transmission means 200 to move the movable units 7 and the side plate 5. When the side plate 5 reaches a desired width, application of the rotational motive power is terminated and the movement of the side wall portion is stopped. It will be noted that the rotational motive power may be applied manually via a handle (not shown) or the like adapted for engaging the large sprocket 2, or by an electric motor (not shown) or any other source of rotational motive power.

Thus according to the above embodiment, full adjustment of an accommodating width of the magazine rack 50 is provided in addition to positional adjustment and alignment of the magazine rack 50 on a conveyer 99.

Hereinbelow a fourth embodiment of the present invention will be described with reference to FIGS. 5-10.

According to the fourth embodiment of the invention, a set accommodating width of a magazine rack 50 may be detected and automatically adjusted to a desired accommodating width. For this, a measuring unit 20, in connection with an arithmetic unit 21 is employed prior to accommodating width adjustment operation. Hereinbelow, the mechanism for automatically controlling an accommodating width of the magazine rack 50 to a desired accommodating width according to the invention, will be explained in detail.

Figure 6:
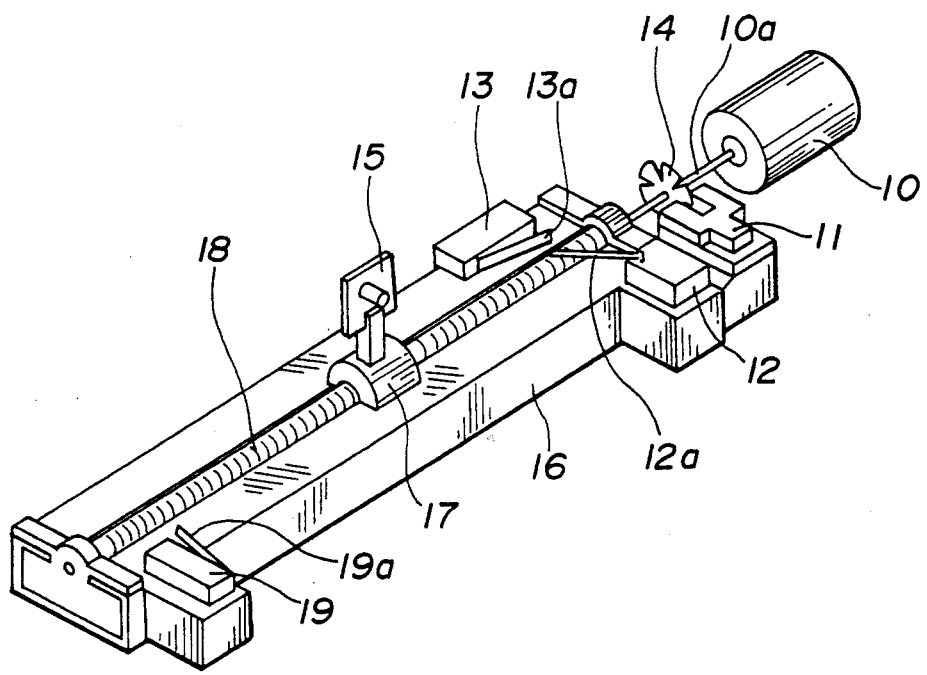
FIG. 6 is a perspective view of a measuring unit utilized in the system of the invention.
Figure 7:
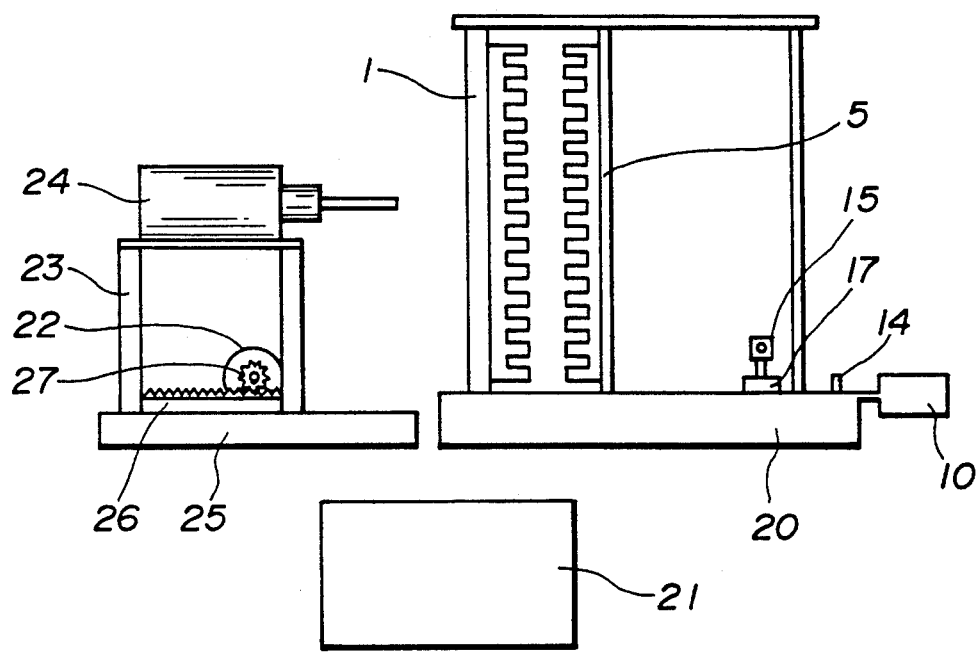
FIG. 7 is a schematic diagram illustrating the action of the major parts of an adjustable magazine rack system according to a first embodiment of the invention.

Referring to FIGS. 6 to 10, when the magazine rack 50 is brought into a predetermined position in front of the measuring unit 20, which position may or may not correspond to the predetermined position for positional adjustment, a motor 10 for moving an optical sensor 15 which forms a part of the measuring unit 20, starts rotation, and a drive shaft 18 which is connected to an output shaft 10a of the motor 10, rotates when the motor 10 is operated. At this time, as best seen in FIG. 6, a thread cut on the surface of the rotatable drive shaft 18, which penetrates the movable unit 17 by way of an opening therethrough, engages with a corresponding thread cut into the inner surface of the opening of the movable unit 17. A portion of the movable unit 17 is in a fitting state with a convex portion of a substantially C-shaped guide rail 16. Thus, according to rotation of the drive shaft 18 via the motor 10, the movable unit 17 is moved along the drive shaft 18 in the direction of a change-over switch 19. At the same time, a slit plate 14, mounted coaxially with the output shaft 10a of the motor 10 is rotated. A light beam from an optical sensor 15 passes through slits formed in the slit plate 14 while the slit plate 14 rotates. Data representative of the rotation of the slit plate 14 is transmitted to the arithmetic unit 21 in the form of pulse signals.

Figure 8:
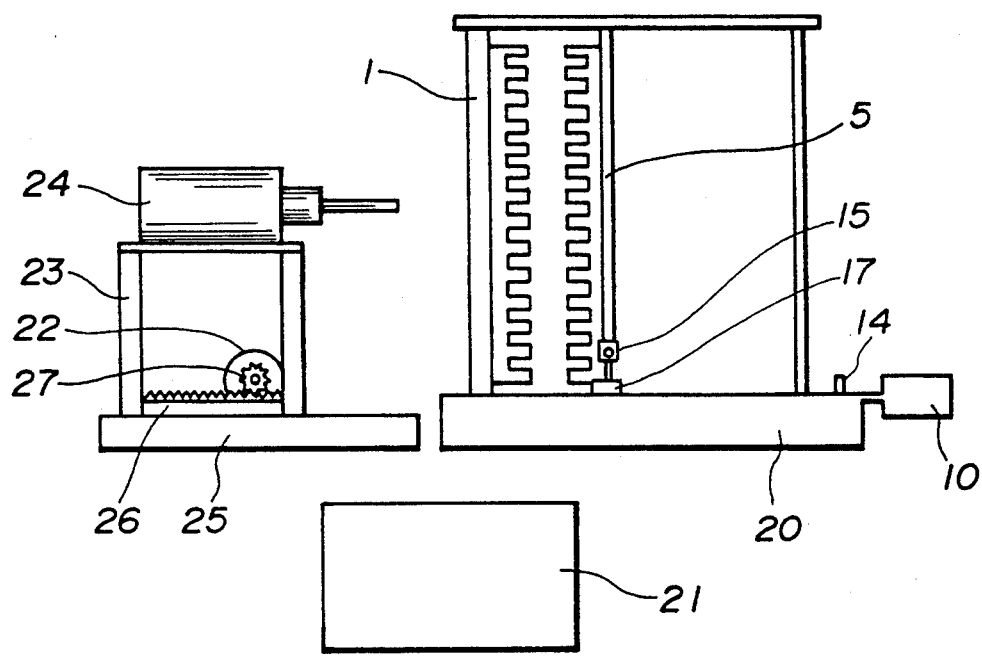
FIG. 8 is a schematic diagram further showing the action of major parts of the system of FIG. 7.

Referring to FIG. 8, when the movable unit 17 arrives at the side face of the movable side plate 5 of the magazine rack 50, the optical sensor 15 fixedly secured to the upper portion of the movable unit 17 senses the movable side plate 5. The arithmetic unit 21 then records, or stores, a number of pulses corresponding to the number of revolutions of the slit plate 14 from the start of the motion of the movable unit 17 up to the above-mentioned point at which the movable side plate is detected by the optical sensor 15. The traveling distance of the movable unit 17 is then calculated on the basis of the number of pulses and the arithmetic unit 21 records the calculation result. In addition, at this time, the electric power supply of the optical sensor 15 is automatically turned off.

Figure 9:
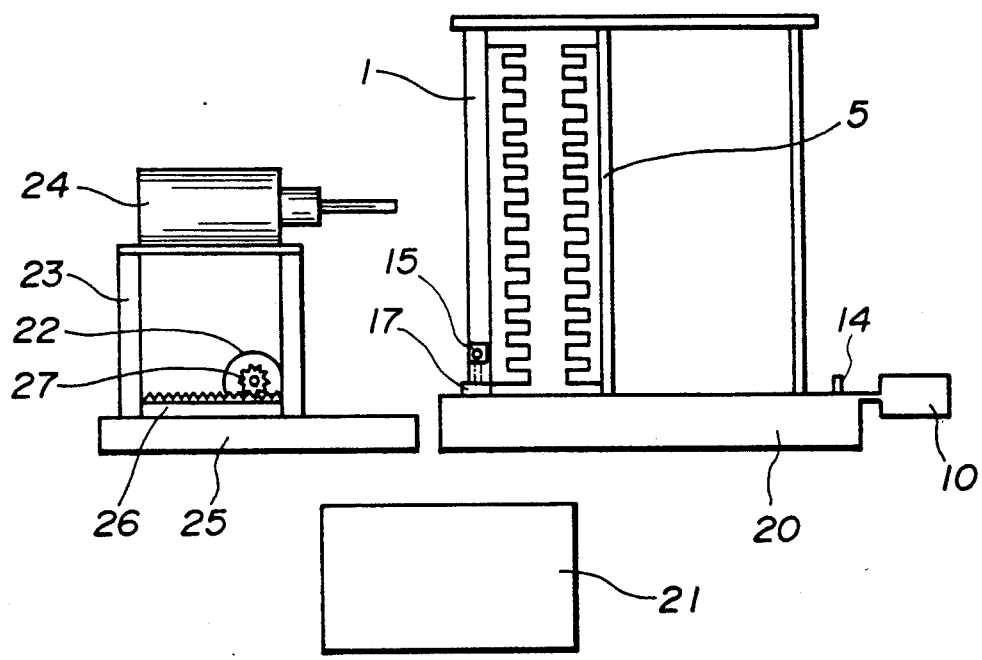
FIG. 9 is another schematic diagram further showing the action of major parts of the system of FIG. 7.
Figure 10:
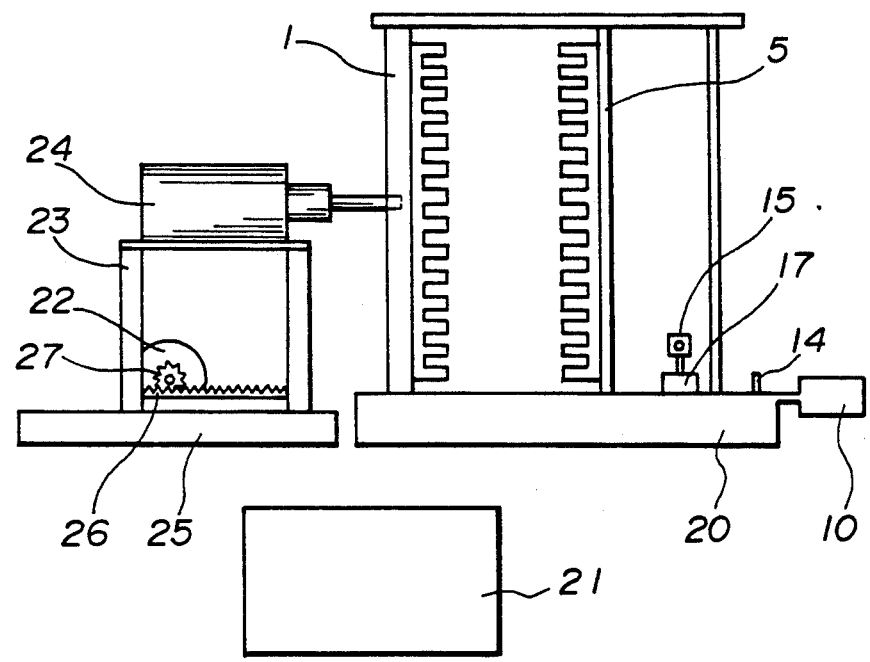
FIG. 10 is also a schematic diagram showing the action of major parts of the system of FIG. 7.

Referring now to FIGS. 6, 9 and 10, after the optical sensor has been switched off, the movable unit 17 continues to move on the guide rail 16 in a direction away from the motor 10, until it reaches the change-over switch 19 which is mounted, for example, at the end of the guide rail 16. When the movable unit 17 reaches the change-over switch 19 it depresses a switch bar 19a thereof, placing the change-over switch 19 in an ON condition. When the change-over switch 19 is ON, the motor 10 is operated so as to rotate in the reverse direction and the movable unit 17 and the attached optical sensor 15 are moved in the opposite direction to the previous direction of movement, i.e. toward the motor 10.

As best seen in FIG. 6, when the movable unit 17 moves toward the motor 10 along the guide rail 16 to arrive close to the end of the guide rail 16 proximate the motor 10, the passage of the movable unit 17 presses a switch bar 13a of a decelerator switch 13, turning the decelerator switch ON, which causes the rotation speed of the motor to be reduced for slowing the motion of the movable unit 17. At this time, the movable unit 17 continues moving in the direction of the motor 10 at reduced speed until a forward portion of the movable unit 17 depresses a switch bar 12a of a motor switch 12, the switch bar thereof being positioned substantially at the end of the drive shaft 18 proximate the motor 10. When the switch bar of the motor switch 12 is depressed the motor 10 is switched OFF and the movement of the movable unit 17 is halted.

After the movable unit 17 is stopped, the arithmetic unit 21 compares the movement distance of the movable unit 17 previously stored at the time of detection of the movable side plate 5 by the optical sensor 15, with a predetermined distance previously stored in the arithmetic unit 21. When a difference between the detected distance and the predetermined distance is present, a driving control unit 75 is operated so as to correct the discrepancy. To facilitate the above calculation, the arithmetic unit may additionally include memory means 21a.

Hereinbelow, the operation of the driving control unit for adjusting an accommodating width of the magazine rack 50 will be described in detail with reference to FIGS. 5 and 10.

Figure 5:
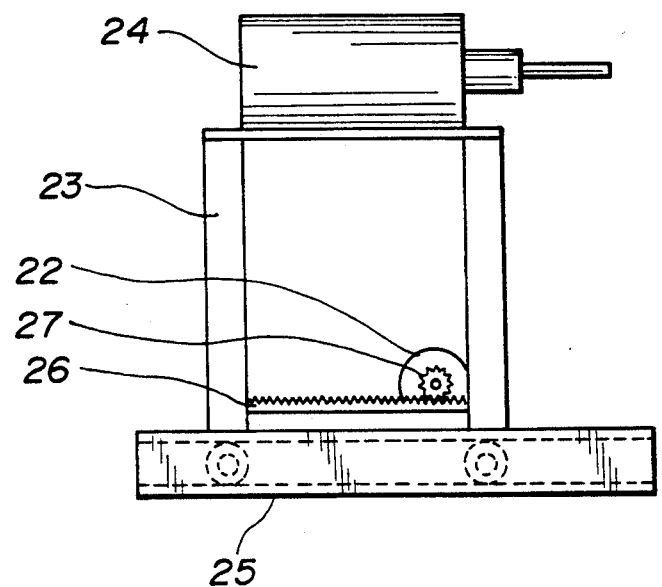
FIG. 5 is a side view of the driving control unit with relevant portions shown by phantom lines.

First, as seen in FIG. 5, an adjustment motor 22 which forms a part of the driving control unit and is fixed independently of a movable frame 23, is activated. The adjustment motor 22 has a output shaft 22a with an end thereof attached to a gear 27 which is engaged with a rack gear 26 to a lower side plate of the movable frame 23 such that the movable frame 23 may be moved according to rotation of the adjustment motor 22 in a direction toward the magazine rack 50 along an adjustment guide rail 25. Owing to this movement, referring to FIG. 10, a forward end of a drive shaft of a drive motor 24 which is fixed to an upper portion of the movable frame 23, is fitted into a center opening of the large sprocket 2. After to drive shaft of the drive motor 24 is engaged with the large sprocket 2, the arithmetic unit 21 activates the drive motor 24 to rotate in a required direction by a necessary number of revolutions so as to move the movable side plate 5 a required distance for correcting the discrepancy calculated previously.

It will be noted that the adjustment motor 22 may be activated by the arithmetic unit 21 or alternatively, may be manually activated by a switch or the like.

After the side plate 5 is moved to the desired position, the drive motor 24 is turned OFF and the arithmetic unit activates the adjustment motor 22 again so as to move the movable frame 23 in a direction away from the magazine rack 50, and the drive shaft of the drive motor 24 is thus disengaged from the large sprocket 2.

The above-described magazine rack 50 and adjustment system operation therefor has been described in terms of the fourth embodiment of the invention with reference to the accompanying drawings, however, the present device is not limited to the above-described example and may be implemented in various other ways without departing from the scope of the invention.

For example, the present system may be operable to operate with a printed circuit board introduction system such that the arithmetic unit 21 and measuring unit 20 of the invention are used to ensure that the accommodating width of the magazine rack 50 corresponds to the width of printed circuit boards to be introduced to the magazine rack 50. Also, the arithmetic unit 21 may be provided data representative of a plurality of accommodating widths such that different circuit boards, or different types of material to be accommodated by the magazine rack 50 may be introduced at different steps of processing, with fully automatic adjustment of the magazine rack 50 being timely carried out according to data stored in the arithmetic unit.

Positional adjustment of such a magazine rack 50, which is part of a production line in which the magazine rack 50 is transported by a chain conveyer, or the like, is also provided.

Thus, according to the present embodiment, a magazine rack 50 of any accommodating width may be introduced to a processing line requiring a specific processing width. The system of the invention is effective to detect the presently set accommodating width of the introduced magazine rack 50 and to effect adjustment of the magazine rack 50 to the required accommodating width in a fully automatic manner. Thus, manual work is reduced and production steps are simplified. Further, this adjustment may be carried out on a conveyer system in which new magazine racks 50 are continuously introduced to the line, or in which magazine racks 50 are transferred from one line to another and adjustment of accommodating width is required after transfer, and the positioning of the magazine racks 50 on such a conveying system may be reliably assured.

Also, a plurality of accommodating width adjustment stations may be provided on a single conveyer 99 such that different processes may be implemented on a single conveying system.

In addition, according to the present invention, various modifications in the construction of the magazine rack 50 are provided within the scope of the invention.

According to a first modification of a magazine rack 50 according to the invention, mounting columns 9 for the movable wall portion 5 are provided with lost motion absorbing means. According to this, a machining tolerances for components of the accommodating width adjustment means may be less precise without impairing the functioning thereof. Thus, design and manufacturing costs for the magazine rack 50 may be considerably reduced.

Figure 14:
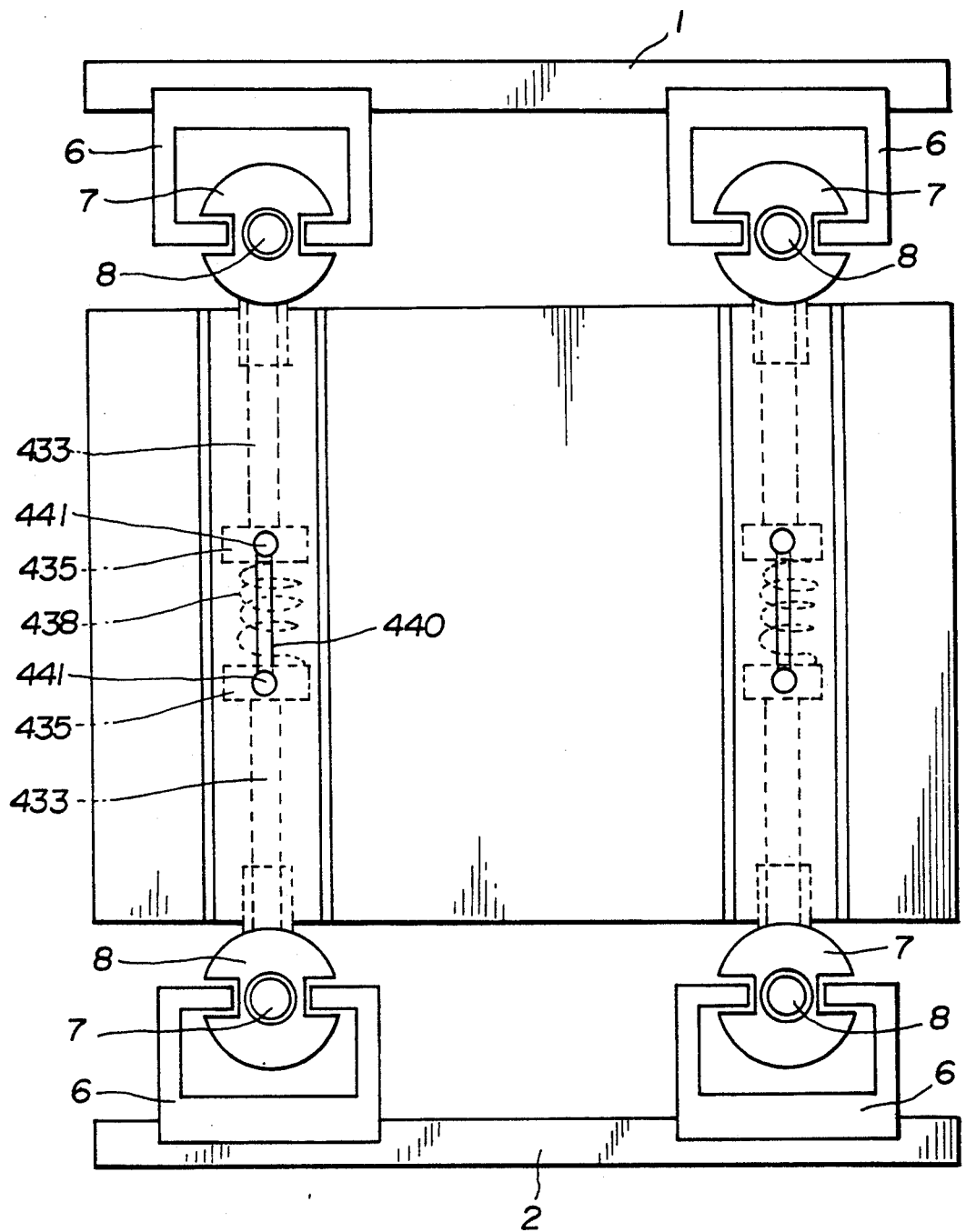
FIG. 14 is a cross-sectional view of an alternative embodiment of a magazine rack and an accommodating width adjustment drive portion therefor having important components thereof shown in phantom lines.
Figure 15:
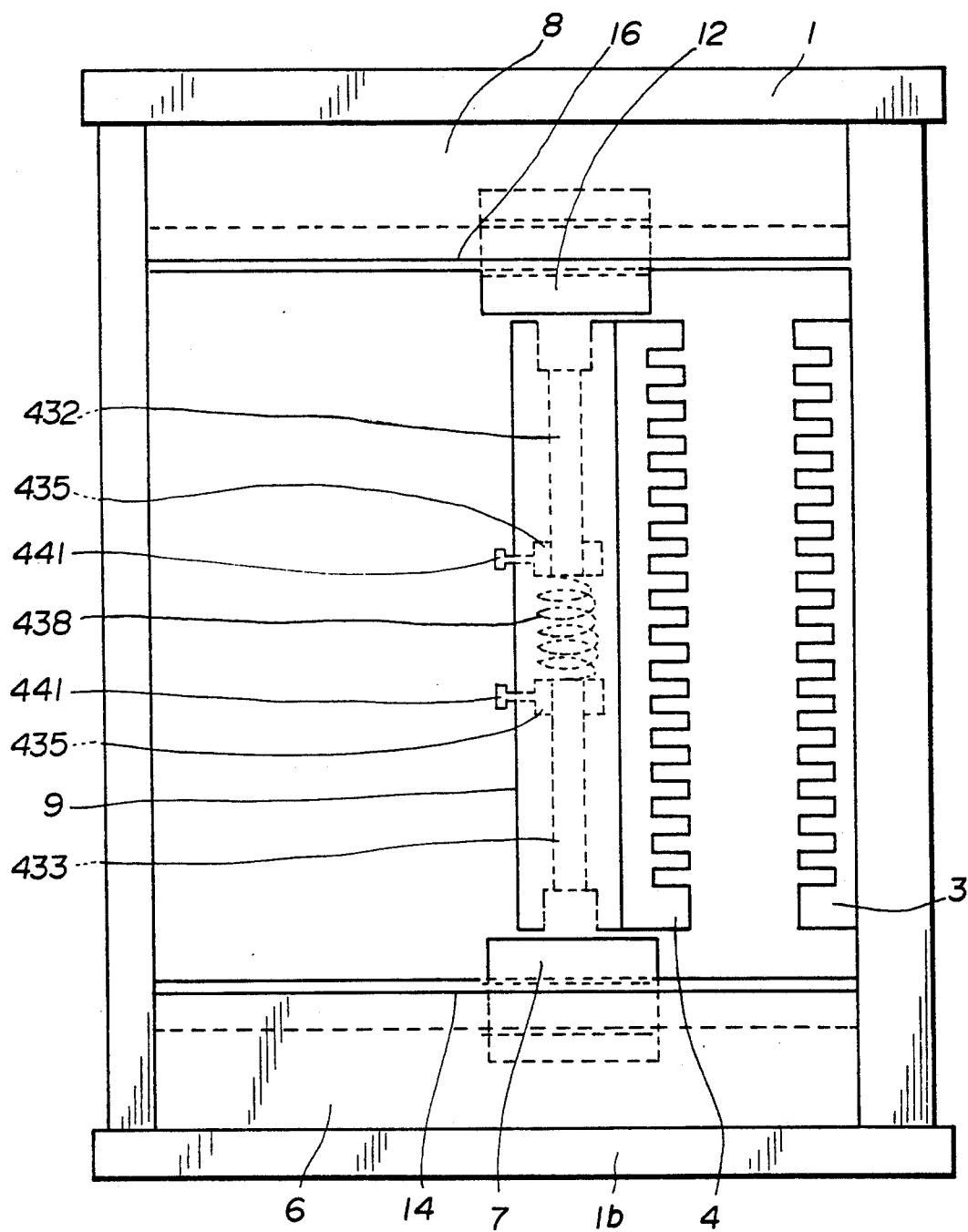
FIG. 15 is an explanatory view of the embodiment of a magazine rack of the invention as shown in FIG. 14.

Referring to FIGS. 14-17, 21 and 22, a mounting column 9 which may be of a hollow rectangular, circular or other shape, which is attached to the movable side wall portion 5 and accepts mounting pegs 7b from upper and/or lower movable units 7 of accommodating width adjustment drive portions 250. To facilitate such modification, as seen in FIG. 14, the mounting pegs 7b are made hollow for receiving a guide shoe 444 of a fixing rod 433 which projects into the mounting column 9. According to the present modification, the fixing rod 433 extends into the mounting column 9 for a distance less than half the length of the mounting column 9, the fixing rod terminating in a stopper portion 435 at the projecting end thereof.

According to the above construction, the movable side wall portion 5 is attached to one or two mounting columns 9, each mounting column 9 receives mounting pegs 7b from upper and lower movable units 7 through openings 9a provided on each end of the mounting column 9. Fixing rods 433 project from each of the upper and lower mounting pegs 7b into the interior of the mounting column 9 to terminate in stopper portions 435 which are opposed to each other in the central area of the interior of the mounting column 9.

Figure 22:
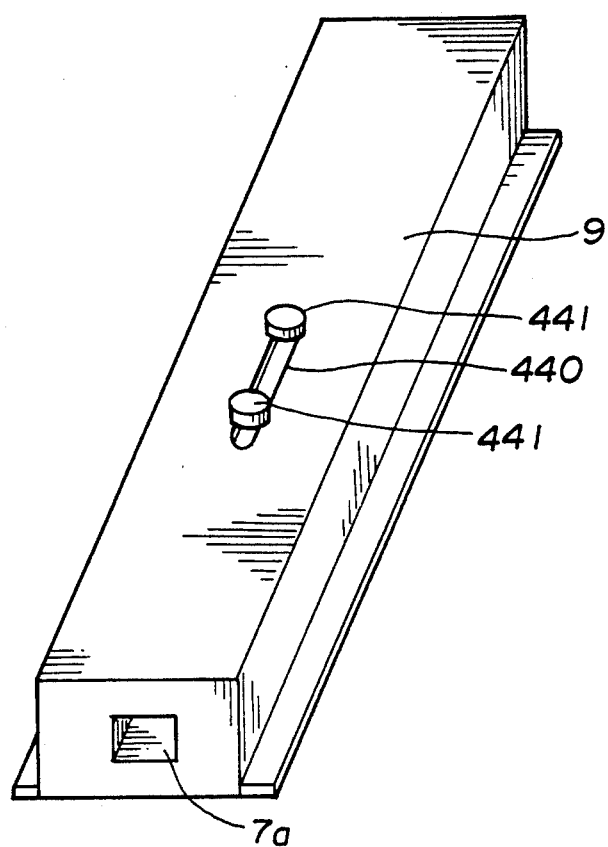
FIG. 22 is a perspective view of a mounting column utilized in the embodiment of FIG. 21.
Figure 23:
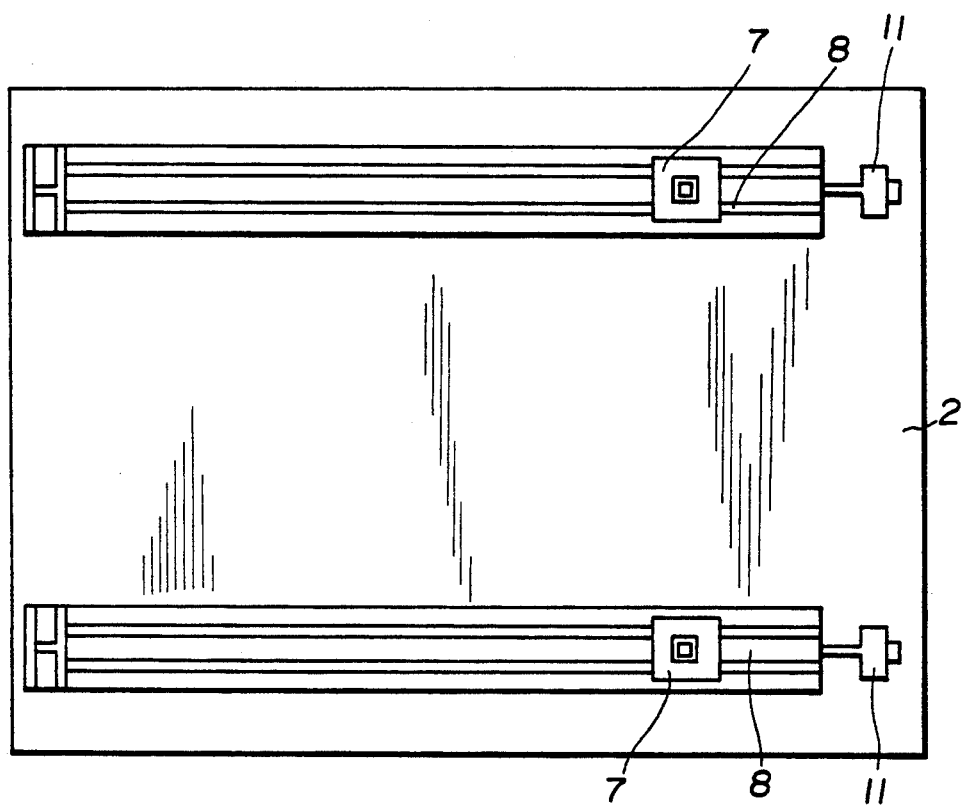
FIG. 23 is a plan view of a floor portion of the magazine rack of the invention including mounting portions for mounting a movable side plate.

Further, as seen in FIG. 22, the mounting column 9 is provided with a setting slot 440 which is a narrow elongate opening in the longitudinal direction of the mounting column which overlaps the regions of the central interior portions of the mounting column 9 occupied by the upper and lower stopper portions 435 of the upper and lower fixing rods 433.

Figure 21:
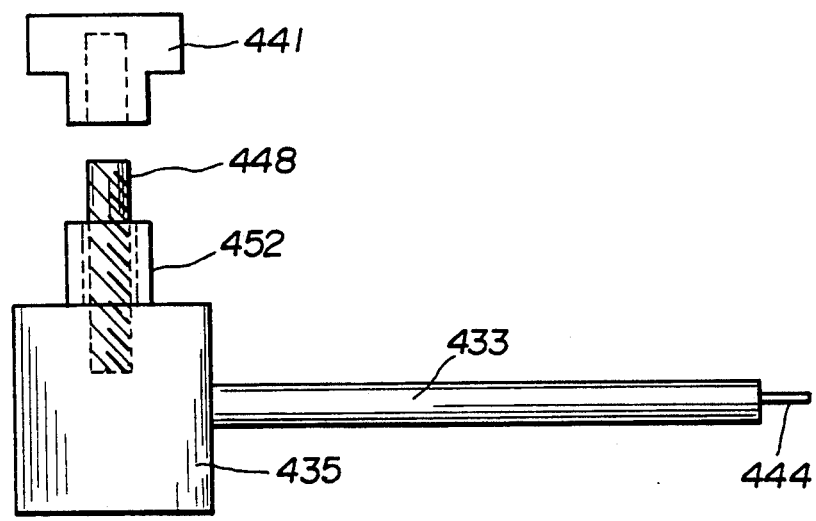
FIG. 21 is a partially transparent side view of an accommodating width adjustment drive portion according to a modification of a magazine rack according to the invention.

Referring now to FIG. 21, projecting from each of the stopper portions 435 perpendicular to the axis of the fixing rods 433 is a threaded shaft 448. Each stopper portion 435 is so aligned that the threaded shaft 448 extends through the setting slot 440 to project from the surface of the mounting column 9. A knob 441 with a threaded opening 441a defined therein is attached to the threaded shaft 448 by being screwed thereon by rotation. Further, at a base portion of the threaded shaft 448, where the threaded shaft 448 projects from the stopper portion 435, a spacer 452 is provided. The spacer 452 may be a rubber washer, or the like.

According to the above-described construction, as the knob 441 is screwed onto the threaded shaft 448, a surface of the mounting column 9 on either side of the setting slot 440 is tightly held between the knob 441 and the spacer 452, thus a position of the fixing rod 433 relative the mounting column a position of a guide shoe 444 of the fixing rod 433 relative the interior of the hollow mounting peg 7b of the movable unit 7 is fixedly established. At an end face of each of the stopper portions 435 a spring seat 435a is defined. A coil spring 438 is fixed between the opposed stopper portions 435 of the upper and lower fixing rods 433 so as to resiliently connect the upper and lower fixing rods 433. According to this arrangement, as seen in FIG. 17, when the accommodating width adjustment mechanism is driven to adjust the accommodating width of the magazine rack 50, Vibration, tension and other stress which may be applied to the mounting column due to uneven movement of the upper and lower movable units 7, dust or dirt in the guide rail 6, machining inconsistencies or other such factors is transmitted to the coil spring resiliently connecting the upper and lower fixing rods 433 to be dissipated without damage to components.

Figure 16:
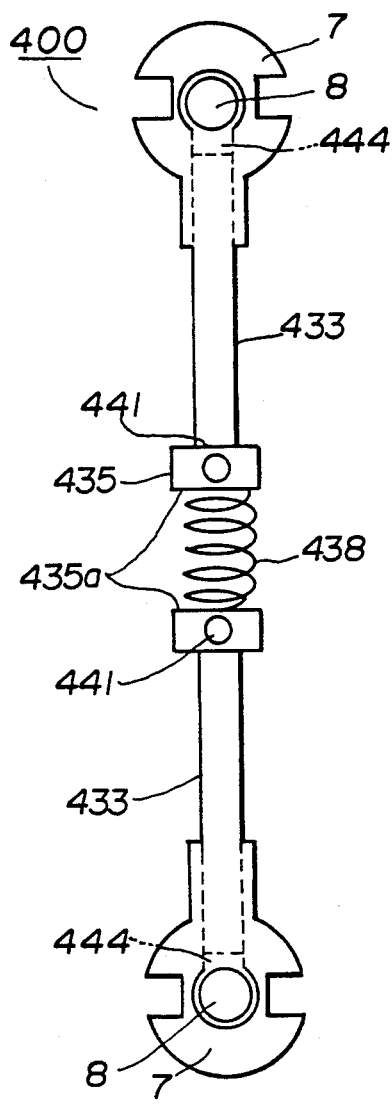
FIGS. 16 and 17 show a side view of a resilient mounting column of according to a modification of a magazine rack according to the invention, showing the mounting column in extended and compressed conditions thereof.
Figure 17:
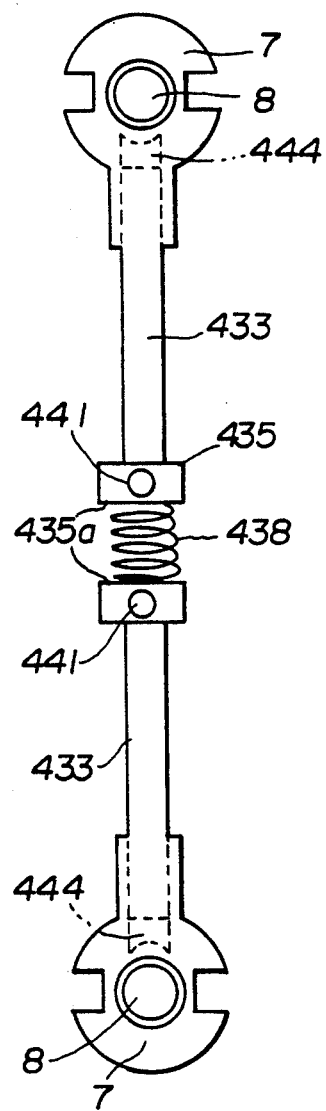

Further, as seen in FIGS. 16 and 17, according to the setting position of the knobs 441 in the setting slot 440 the degree of compression or expansion of the spring 438 may be set for adjusting a sensitivity of the mechanism.

Thus, according to the above described modification, reliability and durability of the accommodating width adjustment mechanism is improved and servicing and machining requirements for the magazine rack 50 are substantially reduced.

It will be noted that the modified mounting column 9 arrangement described hereinabove can be implemented with any of the previously described embodiments of the invention and in conjunction with any of the other modifications to the magazine rack 50 which are discussed below.

Hereinbelow, another modification of a transmission means 201 of the magazine rack 50 according to the invention will be described with reference to FIG. 24.

Figure 24:
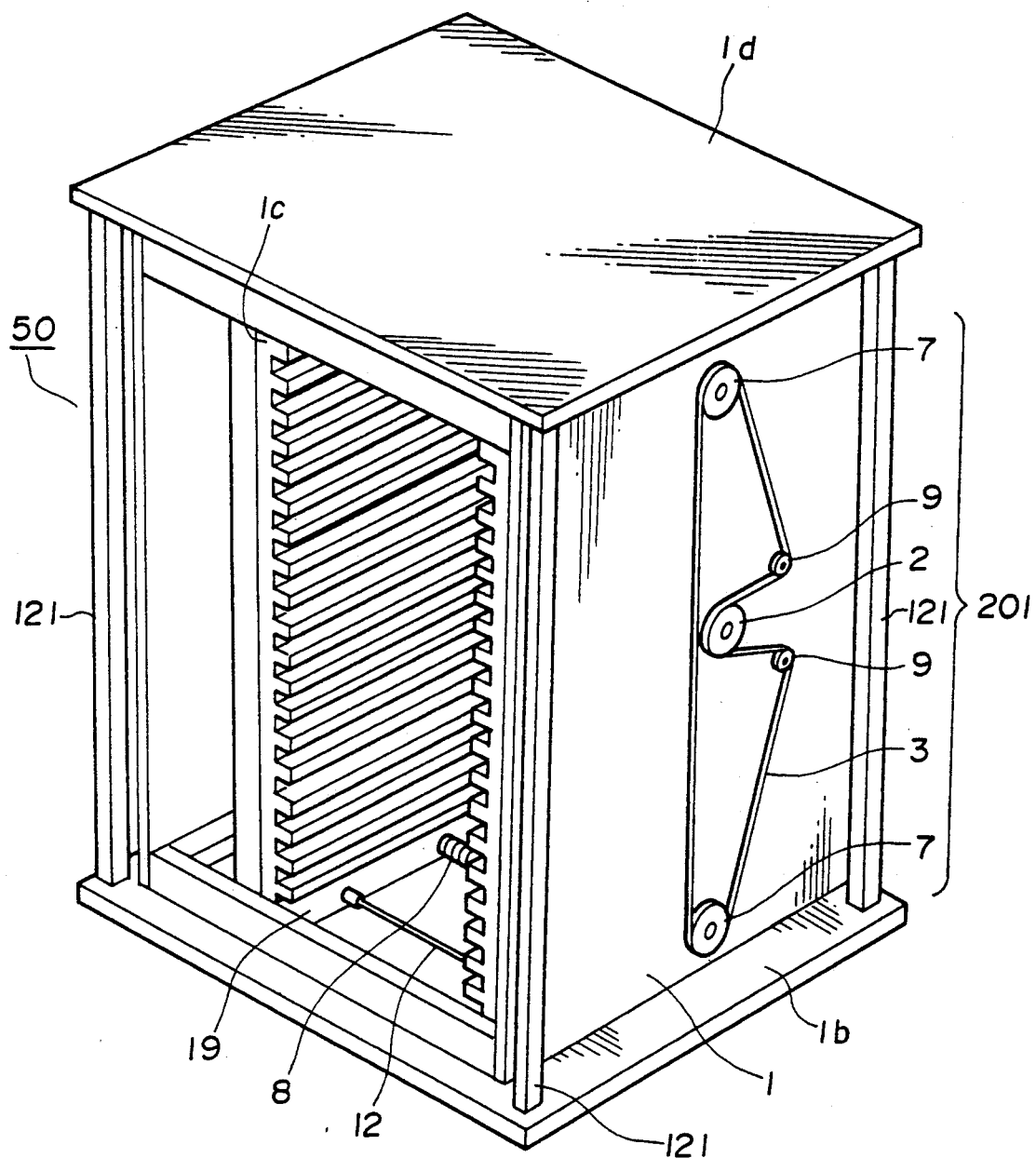
FIG. 24 is a perspective view of a magazine rack according to the invention having a transmission means including two drive sprockets and including corner support columns.

As seen in FIG. 24, according to the present modification, a transmission means 201 for transmitting an input motive power to accommodating width adjustment drive portion 250 of the magazine rack 50, comprises a large sprocket 2 for accepting an input rotational motive power, upper and lower drive sprockets 7, 7 rotatably mounted on threaded drive shafts 8, 8 for turning the threaded drive shafts 8, 8 according to rotation thereof, and may further include upper and lower tensioning, or guide sprockets 9, 9 for applying tensioning to a ladder chain 3 which interconnects the sprockets for transmitting the rotational input motive power. Thus, according to the above-described modification, stable movement of a movable side wall portion 5 may be provided utilizing only one upper and one lower drive shaft thus reducing parts and costs of the accommodating width adjustment driving means and further simplifying the structure of the invention. It will also be noted that the above modification may be implemented with provision of a drive sprocket 77 one only one of the upper or lower sides of the side wall portion, the side not being provided with a drive sprocket and threaded drive shaft being provided with guide shafts only, thus further reducing cost and complexity of the invention.

Figure 26:
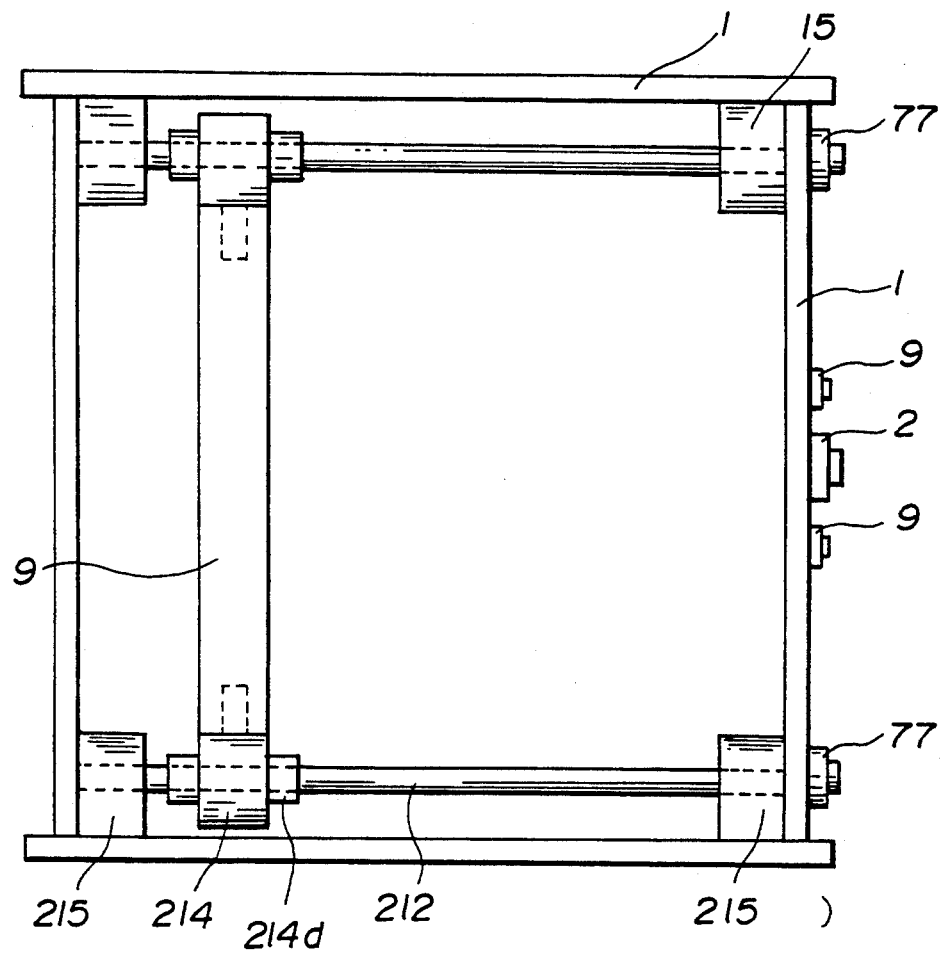
FIG. 26 is a side view of the magazine rack of FIG. 24 with portions of the moving mechanism thereof shown in phantom lines.
Figure 27:
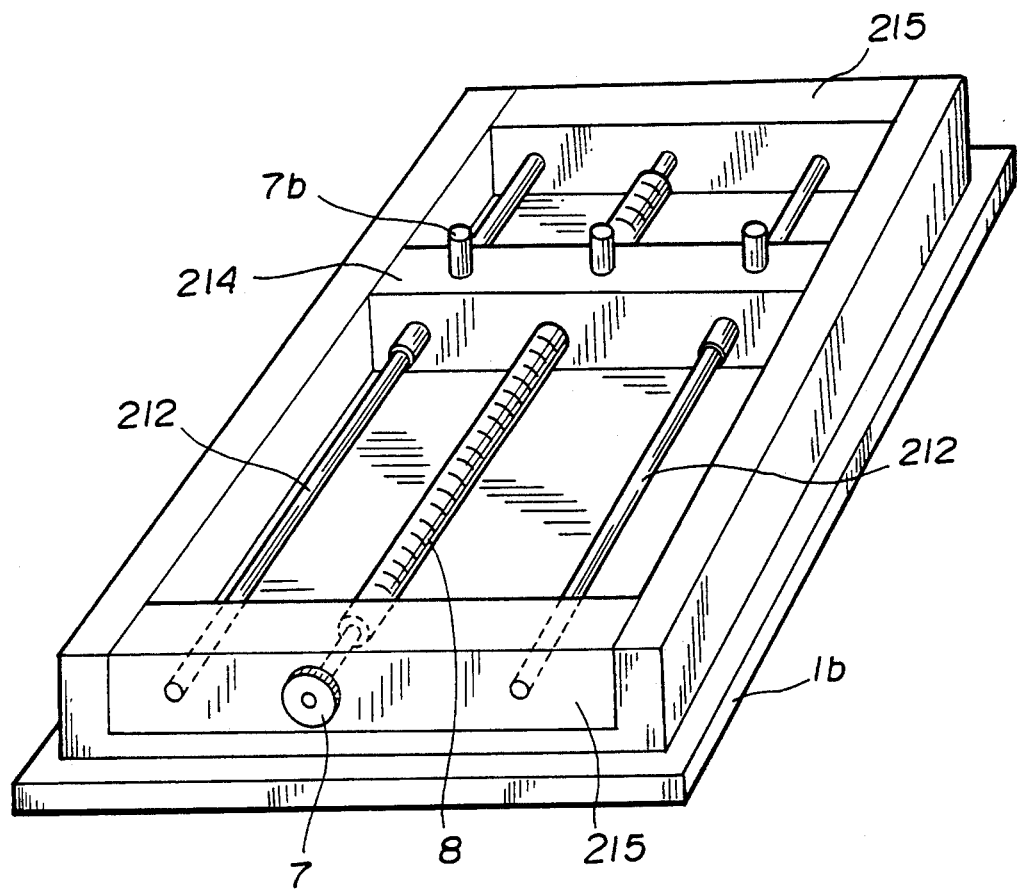
FIG. 27 is a perspective view of a lower moving mechanism utilized in the magazine rack of FIG. 24.
Figure 28:
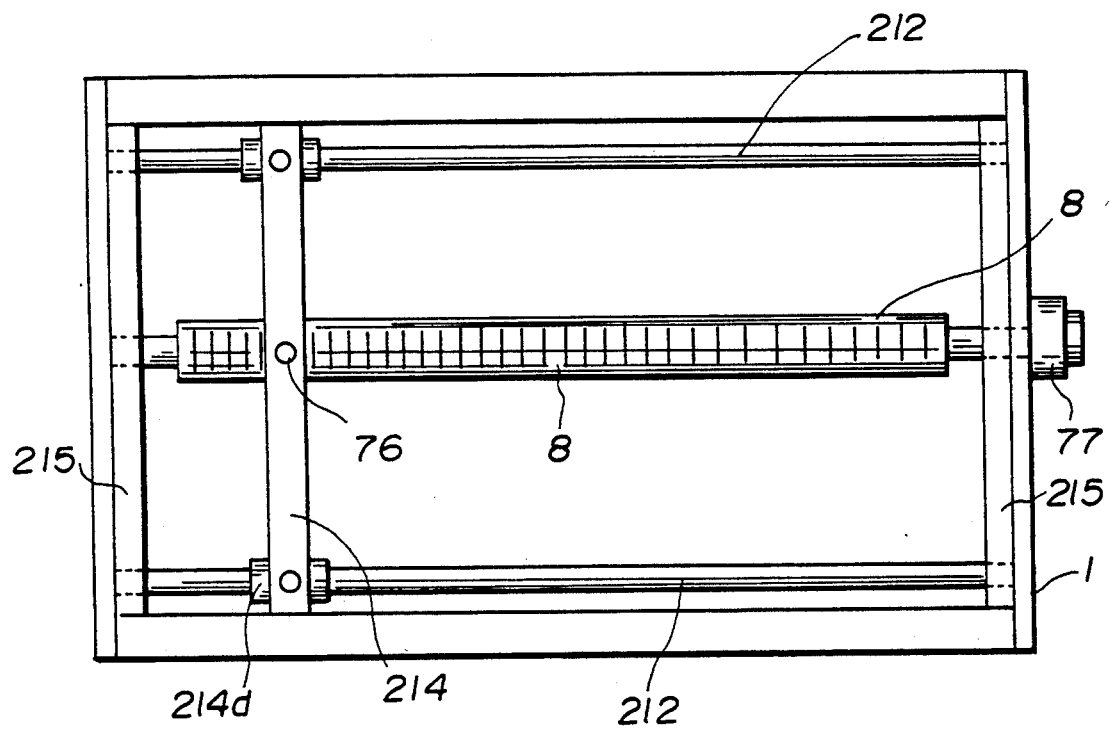
FIG. 28 is a top view of the moving mechanism shown in FIG. 27.

Referring to FIGS. 26–28, a modification of the accommodating width adjustment drive portion 250 is shown for operation in conjunction with the above described simplified transmission portion 200. This modification of the width adjustment drive portion 250 comprises a movable block 214 having two parallel guide openings 214a defined therethrough in a transverse direction and a threaded drive opening 214b defined therethrough, parallel to and between the guide openings 214a. According to the present modification, the guide openings 214a may have pipe portions 214d fitted therein for more smoothly guiding guide shafts 212 therethrough, as will be explained fully hereinlater. Further, as seen in FIG. 28, the movable block 214 has a plurality of mounting pegs 7b projecting from the upper surface thereof for engaging with mounting holes (not shown) formed in edge surfaces of the movable side plate 5, or alternatively for engaging with a mounting column (not shown) attached to the side plate 5. The guide shafts 212 and the threaded drive shaft 8 are mounted in mounting blocks 215 provided at each side of the accommodating width adjustment drive portion 250.

Thus the accommodating width adjustment drive portion 250 of the present invention is preferably provided on top and bottom sides of the magazine rack 50 for assuredly and stably moving the side plate 5 according to an input motive power for adjusting an accommodating width of the magazine rack 50. In such case, a accommodating width adjustment drive portion 250 at the top of the magazine rack 50 would be of a construction inverse to the above described construction. That is, the mounting pegs 7b which project upward from the movable block 214 of the bottom accommodating width adjustment drive portion 250, would project downwardly from the upper accommodating width adjustment drive portion 250 for mounting the movable wall portion 5 at top and bottom edges thereof. Or, as previously stated, the drive portion may be provided only at a top or bottom portion of the magazine rack 50, the opposite side being equipped with guide shafts only.

Figure 29:
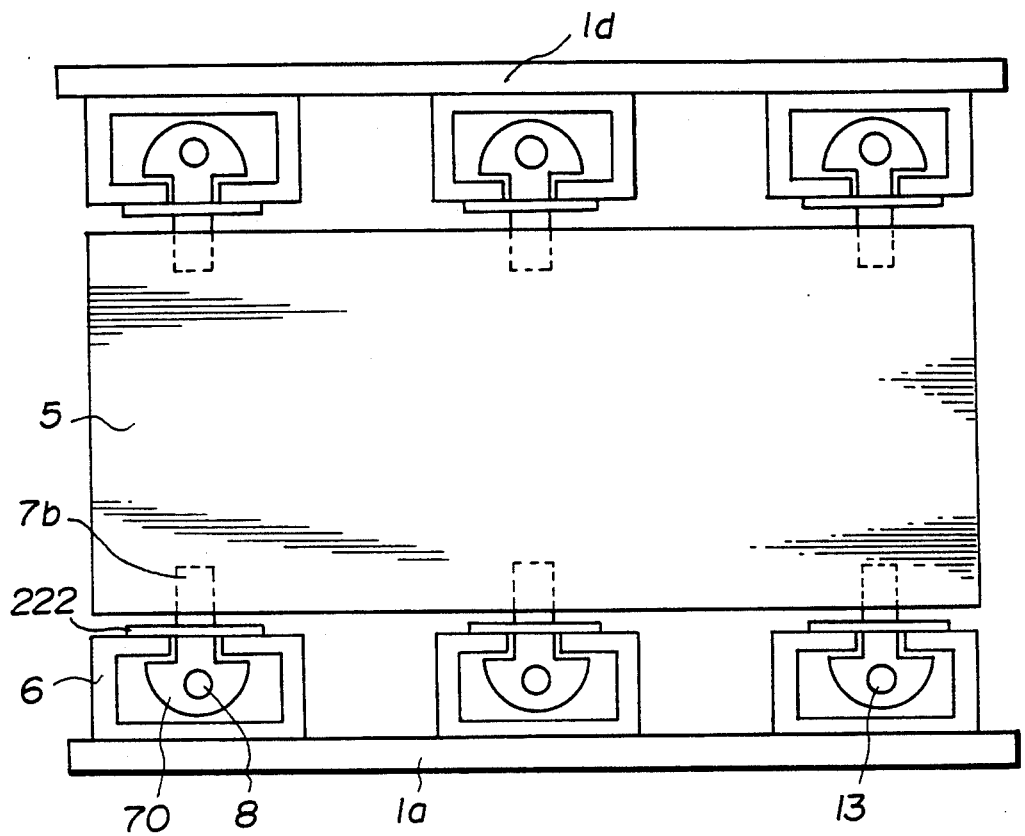
FIG. 29 is a cross-sectional view of another modification of an accommodating width adjustment drive portion which may be implemented for the magazine rack of FIG. 24.
Figure 30:
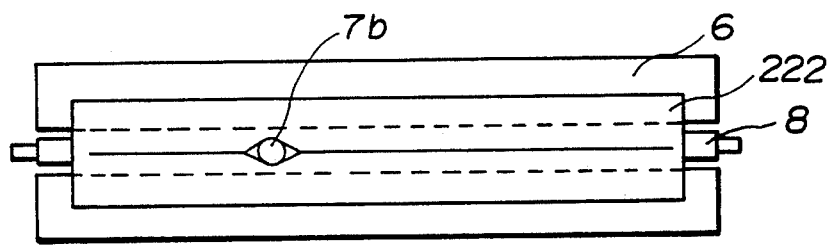
FIG. 30 is a plan view of one of the guide rail units employed in the accommodating width adjustment drive portion of FIG. 29.
Figure 31:
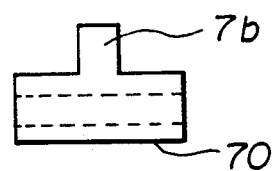
FIG. 31 is a side view of a movable unit of the accommodating width adjustment drive portion of FIG. 30.

Referring to FIGS. 29–31, in yet another alternative modification of a accommodating width adjustment drive portion according to the invention, each of top and bottom accommodating width adjustment drive portions 250 are comprised of a plurality of guide rails 6. Similarly to those taught in the third embodiment. Each of the guide rails 6 being substantially C-shaped in cross section. As seen in FIGS. 29 and 31, the movable units 70 of this modification are formed with a semicircular cross-section such that the main body of the movable unit 70 is mounted entirely within the C-shaped guide rail 6. Referring to FIG. 30, the open portion of the C-shaped guide rails 6 may be covered with a protective sheet 222 having a slit therethrough for permitting a mounting peg 221a of a movable unit 221 to project therethrough. The protective sheet may be of felt or rubber, for example, for preventing dust, etc., from being admitted to the accommodating width adjustment drive portion.

It will be noted that the above described modification of the accommodating width adjustment drive portion 250 may be driven by the previously described simplified modification of the transmission means 201, without alteration.

Alternatively, the protective sheet 222 may not be utilized and a movable unit of circular cross-section may be provided which partially projects from the open side of the C-shaped guide rail, similarly to the movable unit 7 of the third embodiment, as seen in FIG. 12, for example.

Figure 25:
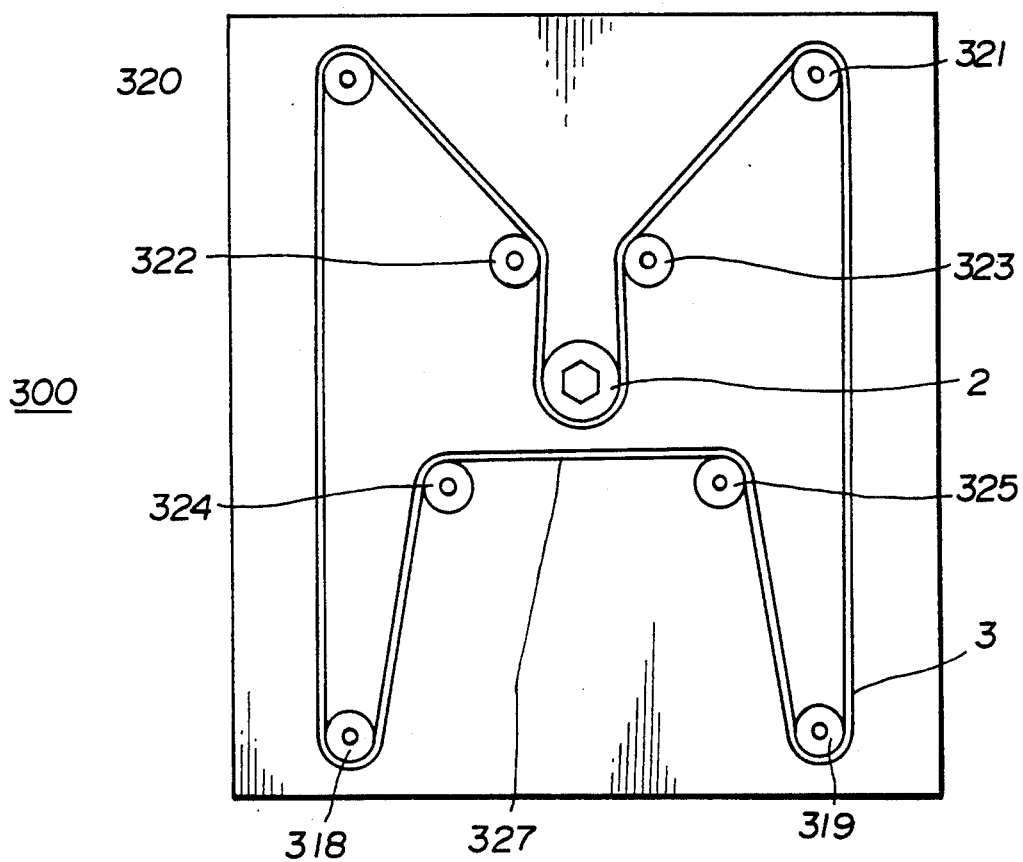
FIG. 25 is a side view of a magazine rack according to the present invention showing a motive power transmission means having four drive sprockets.

Further provided according to the present invention is another alternative construction of a transmission means 300 according to the invention. According to this alternative modification, as seen in FIG. 25, a transmission means 200 comprises a large sprocket 2 capable of receiving and input rotational motive power, left and right upper guide sprockets 323, 323, left and right lower guide sprockets 324, 324, left and right lower drive sprockets 304, 304 and left and right upper drive sprockets 303, 303. Each of the drive upper and lower drive sprockets 303, 303 and 304, 304 are mounted on drive shafts 315 respectively, for turning the drive shafts 315 in accordance with rotation thereof. According to this construction, the transmission means 300, drives two upper and two lower drive shafts 315 concurrently for providing more stable and reliable motive power for smoothly moving the movable wall portion 5 of the magazine rack 50. Or, as with the previously described modifications, the accommodating width adjustment drive portion 250 may be provided only on a top or bottom portion of the magazine rack 50 and only guide portions installed on the opposite side.

Figure 32:
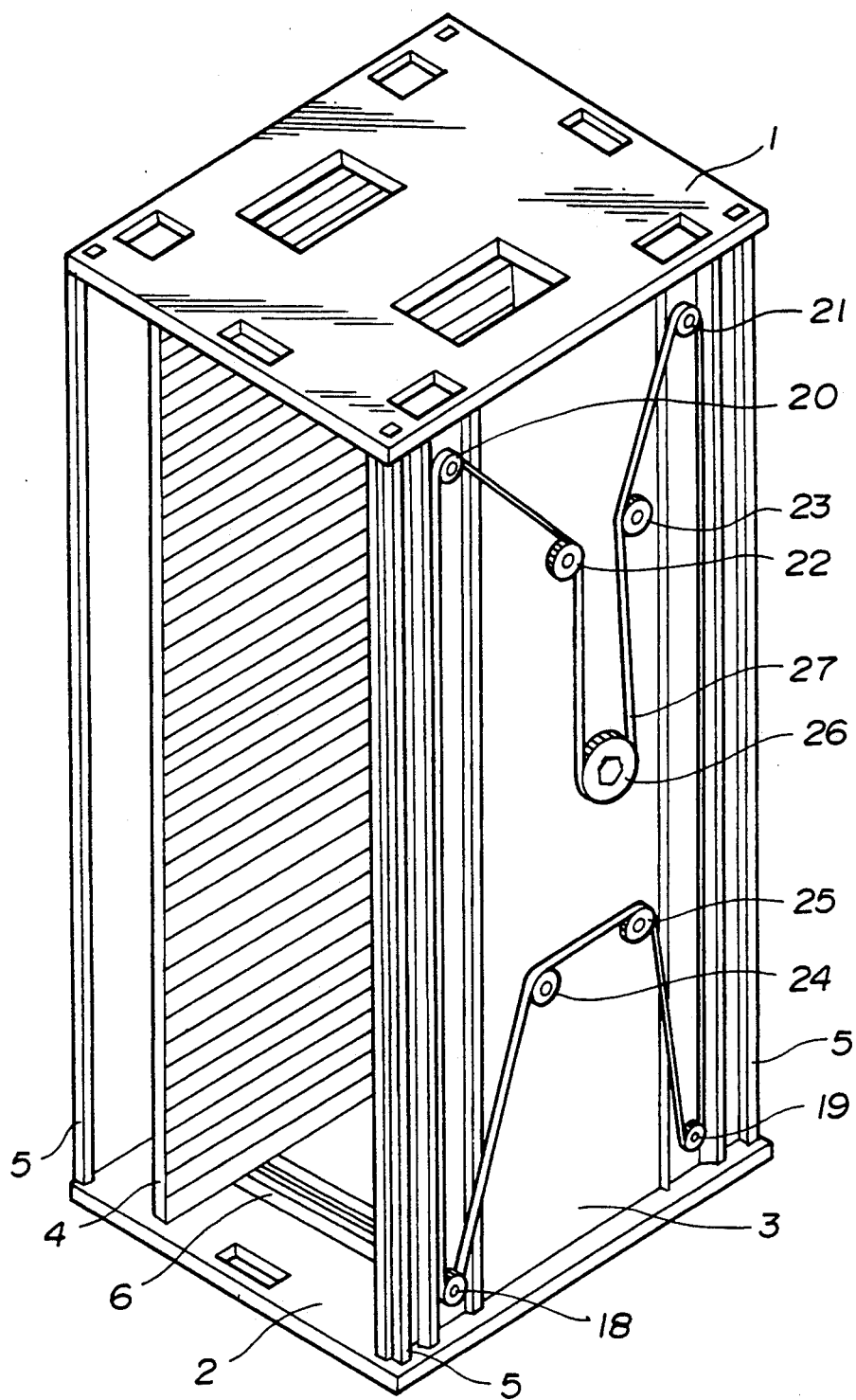
FIG. 32 is a perspective view of an elongated magazine rack according to the system of the invention including a motive power transmission means thereof and weight reducing openings included in a top portion.

In addition, as seen in FIG. 32, portions of top and/or bottom portions of the magazine rack 50 may be provided with a number of openings therethrough for reducing an overall weight of the magazine rack 50 for increasing the ease by which it may be handled by workers etc.

Figure 33:
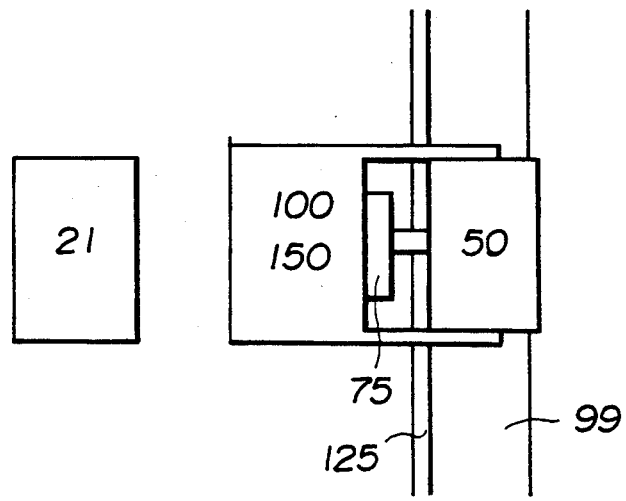
FIG. 33 shows a first arrangement for a system for positioning and adjusting a magazine rack according to the invention.
Figure 34:
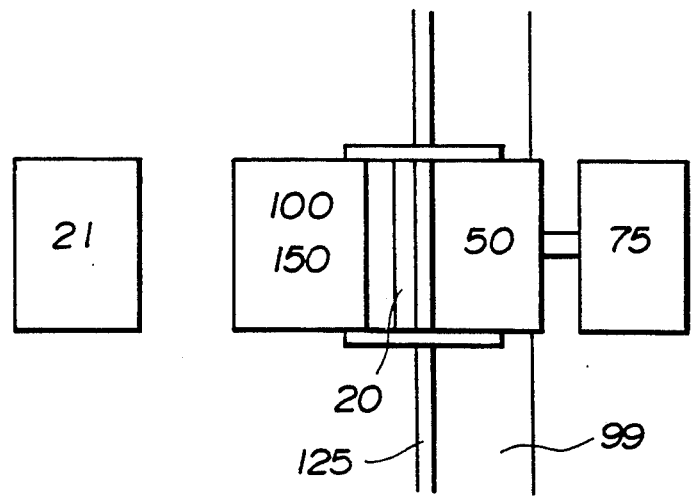
FIG. 34 shows a second arrangement for a system for positioning and adjusting a magazine rack according to the invention.
Figure 35:
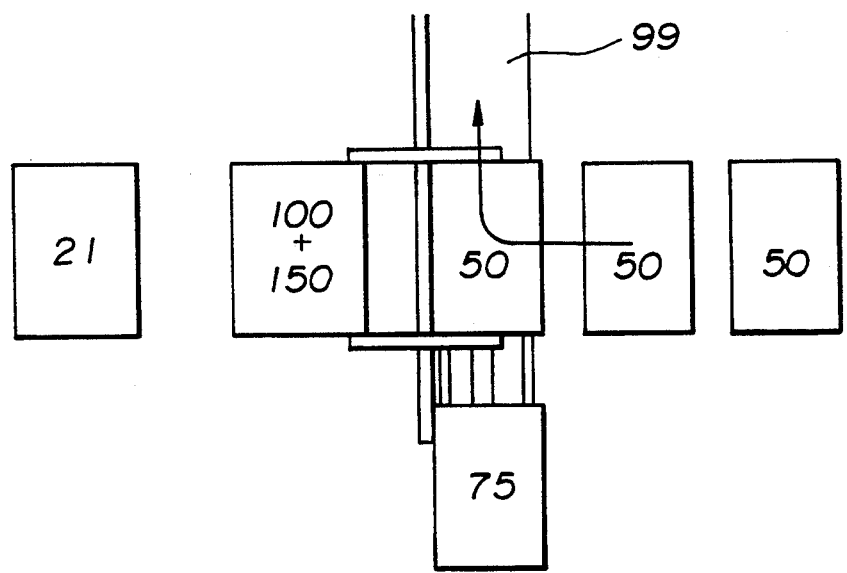
FIG. 35 shows a third arrangement for a system for positioning and adjusting a magazine rack according to the invention.

FIGS. 33–35 show various arrangements by which the components of the invention may be integrated as a system for effecting substantially simultaneous lateral positioning, alignment as well as accommodating width detection and adjustment thereof.

As may be seen, in FIG. 33 the lateral positional adjustment mechanism 100 including alignment mechanism 150 is integrated with the driving control unit 75 to move therewith for effecting positioning adjustment and alignment with engagement of the driving control unit with the transmission means of the magazine rack 50 for adjustment under control of the arithmetic unit 21. These operations may be carried out at a single predetermined position on the conveyer 99. It will be noted that a facing direction of the magazine rack may be in the forward or rearward direction of the conveyer 99.

In FIG. 34 an alternative arrangement is shown in which the lateral positional adjustment mechanism 100 including alignment mechanism 150 effect lateral positioning adjustment and alignment of the magazine rack 50 on the conveyer 99 when the magazine rack is faced toward the lateral positional adjustment mechanism 100. The driving control unit 75 is controlled from the opposite side to effect adjustment of an accommodating width of the magazine rack 50, which may be effected according to a present accommodating width detected by the measuring unit 20 which may be provided at the base of the lateral positional adjustment mechanism 100, the above being controlled by the arithmetic means 21.

Finally, in FIG. 35, an arrangement is shown in which the lateral positional adjustment mechanism 100, which may be provided with the alignment mechanism 150, effects lateral positional adjustment (and alignment) at a beginning of the conveyer 99. The driving control unit 75 being provided at an end of the conveyer 99 for adjusting an accommodating width of the magazine racks 50 as they are introduced to the conveyer 99. It will be noted that the facing direction of the magazine rack 50 may be to the left or right according to this arrangement. Further, the arithmetic control unit may control the above operations and may further integrate the measuring unit 20 for detecting a present accommodating width of the magazine racks 50 as they are introduced to the conveyer 99.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magazine rack and positional adjustment system therefor, comprising:

an essentially box-shaped magazine rack having opposing side wall portions, a base portion and accommodating portions arranged at the inner side of the wall portions;

a conveyer upon which said magazine rack is carried;

a lateral positional adjustment mechanism including at least a pair of arm members, a space between said arm members being substantially equal to a width of said magazine rack, said arm members having plane surface portions on facing surfaces thereof and outwardly curved portions at distal ends thereof; and drive means drivable of said lateral positional adjustment mechanism in a direction toward said conveyer such that corners of the magazine rack, stopped by said conveyer at a predetermined position in front of said lateral positional adjustment mechanism, closest to the arm members contact said outwardly curved portions of said distal ends of said arm members, said drive means driving said arm members further in the direction of said conveyer until opposites sides of said magazine rack contact said plane surface portions of said arm members, said drive means then being operable to return the lateral positional adjustment mechanism to an initial state so as to be ready to perform adjustment operation for the next magazine rack on the conveyer.

2. A system as set forth in claim 1, wherein said lateral positional adjustment mechanism includes three or more arms members.

3. A system as set forth in claim 1, further including control means for automatically stopping said conveyer at said predetermined position and actuating said lateral positional adjustment mechanism.

4. A system as set forth in claim 1, wherein said magazine rack is additionally provided, on at least two corners thereof, with support columns which are set at opposing corners on one side of the magazine rack such that front and rear faces of the support columns are defined at outer sides of at least two corners of the base portion of the magazine rack;

said conveyer being additionally provided with an alignment rail on a side thereof proximate said lateral positional adjustment mechanism and at least in the vicinity of said lateral positional adjustment mechanism;

said lateral positional adjustment mechanism being additionally provided on each arm thereof, with a conveyer alignment direction adjustment mechanism comprising a support column presser mounted on a pivot shaft and presser driving means therefore;

wherein the above lateral positional adjustment mechanism is operable, before said retraction step is initiated, to actuate said presser driving means thereby rotating the support column pressers inwardly so as to contact a rear face of the support columns, pushing the magazine rack such that the front faces of the support columns are pressed flush against an inner face the aligning rail of the conveyer suitably aligning the magazine rack on the conveyer the lateral positional adjustment mechanism then being operable in a reverse operation such that the support column pressers are retracted from contact with the support columns of the magazine rack and the arms are retracted away from the conveyor holding the magazine rack returned to an initial state so as to be ready to perform adjustment and alignment operations for a subsequent next magazine rack on the conveyor.

5. A system as set forth in claim 4, further including control means for automatically stopping said conveyer at said predetermined position and actuating said lateral positional adjustment mechanism.

6. A system as set forth in claim 1, wherein an accommodating width of the magazine rack may be effected, said magazine rack being additionally provided with;

accommodating width adjustment means comprising a movable unit provided at said base portion of said magazine rack, one of said side wall portions being movably mounted on said movable unit;

transmission means for receiving an input rotational motive power in a one point manner and transmitting said input rotational motive power to a said movable unit of said accommodating width adjustment means.

7. A system as set forth in claim 4, wherein an accommodating width of the magazine rack may be effected, said magazine rack being additionally provided with;

accommodating width adjustment means comprising a movable unit provided at said base portion of said magazine rack, one of said side wall portions being movably mounted on said movable unit;

transmission means for receiving an input rotational motive power in a one point manner and transmitting said input rotational motive power to a said movable unit of said accommodating width adjustment means.

8. A system as set forth in claim 6, wherein a plurality of said movable units are provided.

9. A system as set forth in claim 6, wherein said magazine rack further includes a top portion, said top portion further including accommodating width adjustment means, said transmission means transmitting said input rotational motive power to movable units of each of upper and lower accommodating width adjustment means.

10. A system as set forth in claim 9, wherein each of said upper and lower accommodating width adjustment means are provided with a plurality of said movable units, respectively.

11. A system as set forth in claim 6, wherein said transmission means comprises a main sprocket positioned at a central portion of an outer side of a stationary one of said side wall portions said main sprocket accepting motive power from an external power source, rotation of the main sprocket transmitting motive power via a ladder chain to a drive sprocket mounted on a drive shaft on which said movable unit is mounted, contact between the threaded drive shaft and the movable unit being maintained in an engaged state by means of interengaging threads provided on the outer surface of said drive shaft and on the inner surface of an opening through the movable unit through which the drive shaft passes, said movable unit further having grooved portions a thereof fitted to convex portions a of substantially a C-shaped guide rail to effect horizontal movement of the movable unit on the guide rails according to rotation of the threaded drive shaft, moving said accommodating portions provided on the inner side of said movable side wall portion closer to corresponding accommodating portions mounting on the inner surface of a stationary side wall mounting the transmission means.

12. A system as set forth in claim 11, wherein a plurality of said movable units and guide rails are provided, respectively.

13. A system as set forth in claim 11, wherein said magazine rack further includes a top portion, said top portion further including accommodating width adjustment means, said transmission means transmitting said input rotational motive power to movable units of each of upper and lower accommodating width adjustment means.

14. A system as set forth in claim 13, wherein each of said upper and lower accommodating width adjustment means are provided with a plurality of said movable units, and guide rails respectively.

15. A system as set forth in claim 6, wherein said movable unit is additionally provided with a projecting mounting peg formed to project upwardly from said movable unit, the mounting peg being inserted inside of a mounting column secured to one face of the movable side wall portion such that the mounting column performs horizontal movement according to the horizontal movement of the movable unit on the guide rail moving said accommodating portions provided on the inner side of said movable side wall portion closer to corresponding accommodating portions mounting on the inner surface of a stationary side wall mounting the transmission means.

16. A system as set forth in claim 15, wherein a plurality of said movable units with said mounting pegs and guide rails are provided, respectively.

17. A system as set forth in claim 15, wherein said magazine rack further includes a top portion, said top portion further including accommodating width adjustment means, a movable unit of an upper accommodating width adjustment means being provided with a mounting peg projecting downward being inserted inside of an upper portion of a said mounting column, such that said mounting column is secured between upper and lower mounting pegs of said upper and lower accommodating width adjustment means, said transmission means transmitting said input rotational motive power to movable units of each of upper and lower accommodating width adjustment means.

18. A system as set forth in claim 17, wherein each of said upper and lower accommodating width adjustment means are provided with a plurality of said movable units with mounting pegs, and guide rails respectively, a number of said upper movable units corresponding to a number of lower movable units.

19. A system as set forth in claim 18, wherein a plurality of mounting columns is provided corresponding to a number of upper or lower mounting pegs.

20. A system as set forth in claim 6, wherein operation of said accommodating width adjustment means is effected when the magazine rack is held at the predetermined position on the conveyer for positional adjustment thereof.

21. A system as set forth in claim 6, wherein adjustment of the accommodating width is effected at a position other than the predetermined position for positional adjustment.

22. A system as set forth in claim 6, wherein the accommodating width of said magazine rack is effected prior to being introduced to the conveyer.

23. A system as set forth in claim 6, wherein said rotational motive power is applied manually via a handle adapted for engaging the main sprocket.

24. A system as set forth in claim 6, wherein said rotational motive power is applied by an electric motor having an output shaft thereof adapted for engaging the main sprocket.

25. A system as set forth in claim 11, wherein at least one additional sprocket is provided for guiding said ladder chain.

26. A system as set forth in claim 6, wherein said transmission means comprises a main pulley positioned at a central portion of an outer side of a stationary one of said side wall portions said main pulley accepting motive power from an external power source, rotation of the main pulley transmitting motive power via a belt to a drive pulley mounted on a drive shaft on which said movable unit is mounted, contact between the drive shaft and the movable unit being maintained in an engaged state by means of interengaging threads provided on the outer surface of said drive shaft and on the inner surface of an opening through the movable unit through which the drive shaft passes, said movable unit further having grooved portions thereof fitted to convex portions a of substantially a C-shaped guide rail to effect horizontal movement of the movable unit on the guide rails according to rotation of the threaded drive shaft, moving said accommodating portions provided on the inner side of said movable side wall portion closer to corresponding accommodating portions mounting on the inner surface of the stationary side wall mounting the transmission means.

27. A system as set forth in claim 26, wherein said rotational motive power is applied manually via a handle adapted for engaging the main pulley.

28. A system as set forth in claim 26, wherein said rotational motive power is applied by an electric motor having an output shaft thereof adapted for engaging the main pulley.

29. A system as set forth in claim 26, wherein at least one additional pulley is provided for tensioning said belt.

30. A system as set forth in claim 6, wherein adjustment of said accommodating width via said accommodating width adjustment means is effected automatically via a driving control unit, said driving control unit comprising;
    an adjustment motor operable to drive said driving control unit toward said magazine rack when said magazine rack is stationary at a predetermined position on said conveyer;

a drive motor, fixed to an upper portion of said driving control unit and having an output shaft thereof adapted so as to engage said transmission means an operable to apply rotational motive power to said transmission means for driving said accommodating width adjustment means, moving said movable side wall portion of said magazine rack to establish a selected accommodating width thereof, said adjustment motor further operable to move said driving control unit in a direction away from said magazine rack so as to disengage said output shaft of said drive motor from said transmission means of said magazine rack after accommodating width adjustment is complete.

31. A system as set forth in claim 6, wherein a set accommodating width of a magazine rack may be detected via a measuring unit, said measuring unit comprising;

a movable unit mounted on a drive shaft for movement according to rotation of said drive shaft;

a guide rail for guiding movement of said movable unit;

drive means having an output shaft engaging said drive shaft for rotating said drive shaft;

optical sensing means mounted on said movable unit, emitting a light beam therefrom in the direction of said drive means, said optical sensing means detective of a position of a movable side wall portion of a magazine rack, and operative to become OFF upon detection of said movable side wall portion of said magazine rack;

an arithmetic unit;

a slit plate mounted coaxially with the output shaft of said drive means, said light beam of said optical sensing means passing through slits formed in the slit plate while the slit plate rotates, data representative of the rotation of the slit plate being transmitted to the arithmetic unit in the form of pulse signals, said arithmetic unit calculating the traveling distance of the movable unit on the basis of the number of pulse signals received from the start of motion of said movable unit until switching off of said optical sensor.

32. A system as set forth in claim 31, wherein said measuring unit additionally includes a change-over switch for reversing a rotational direction of said drive means when said movable unit is driven by said drive shaft to an end thereof opposite an end engaging said drive means, after said optical sensor is switched off, the movable unit continues to move on the guide rail in a direction away from the motor until it reaches the change-over switch, the movable unit activating said change-over switch placing the change-over switch in an on condition such that said drive means is operated so as to rotate in the reverse direction and the movable unit and the optical sensor are moved toward the motor to stop movement upon reaching an initial position thereof, after the movable unit is stopped at said initial position, the arithmetic unit being operative to compare movement distance of the movable unit stored at the time of switching off of the optical sensor with a predetermined distance total travel distance of said movable unit previously stored in the arithmetic unit for calculating a discrepancy between a present position of said movable side plate and a predetermined desired position thereof.

33. A system as set forth in claim 32, wherein said measuring unit further includes a motor switch positioned substantially at the end of the drive shaft proximate the drive means, the motor switch being switched OFF upon contact by the movable unit, and the movement of the movable unit is halted.

34. A system as set forth in claim 30, wherein said measuring unit further includes a decelerator switch at a position close to the end of said drive shaft engaging said output shaft of said drive means, passage of the movable unit presses a switch bar of said decelerator switch turning the decelerator switch on, causing the rotation speed of the motor to be reduced for slowing the motion of the movable unit.

35. A system as set forth in claim 32, wherein said measuring unit further includes a decelerator switch at a position close to the end of said drive shaft engaging said output shaft of said drive means, passage of the movable unit presses a switch bar of said decelerator switch turning the decelerator switch on, causing the rotation speed of the motor to be reduced for slowing the motion of the movable unit and, a motor switch positioned substantially at the end of the drive shaft proximate the drive means, the motor switch being switched OFF upon contact by the movable unit, and the movement of the movable unit is halted.

36. A system as set forth in claim 32, wherein, when a difference between the detected distance and the predetermined desired distance is present, a driving control unit is operated so as to correct the discrepancy, said driving control unit comprising;

an adjustment motor operable to drive said driving control unit toward said magazine rack when said magazine rack is stationary at a predetermined position on said conveyer;

a drive motor, fixed to an upper portion of said driving control unit and having an output shaft thereof adapted so as to engage said transmission means, after said output shaft of the drive motor is engaged with said transmission means said arithmetic unit activating the drive motor to rotate in a required direction by a necessary number of revolutions so as to move the movable side plate a required distance for correcting the discrepancy calculated previously and, after the side plate is moved to the desired position, the drive motor is turned OFF and the arithmetic unit activates the adjustment motor again so as to move the movable frame in a direction away from the magazine rack such that the drive shaft of the drive motor is disengaged from said transmission means.

37. A system as set forth in claim 1, wherein said conveyer is a chain conveyer.

38. A system as set forth in claim 30, wherein said predetermined position for accommodating width adjustment via said driving control unit corresponds to said predetermined position for lateral positional adjustment.

39. A system as set forth in claim 30, wherein said adjustment motor is activated by an arithmetic unit.

40. A system as set forth in claim 30, wherein said adjustment motor is manually activated via a switch.

41. A system as set forth in claim 36, wherein the arithmetic unit is provided data representative of a plurality of accommodating widths such that different types of material to be accommodated by the magazine rack may be introduced at different steps in processing, with fully automatic adjustment of the magazine rack being timely carried out according to data stored in the arithmetic unit.

42. A system as set forth in claim 30, wherein a plurality of accommodating width adjustment stations comprising driving control units, are be provided on a single conveyer such that different processes may be implemented on a single conveyer.

43. A system as set forth in claim 36, wherein a plurality of accommodating width adjustment stations comprising driving control units, are be provided on a single conveyer such that different processes may be implemented on a single conveyer.

44. A system as set forth in claim 17, wherein said magazine rack further includes lost motion absorbing means comprising:
a mounting column attached to the movable side wall portion and accepting mounting pegs from upper and lower movable units of accommodating width adjustment drive portions, said the mounting pegs being hollow for receiving a guide shoe of upper and lower fixing rods provided inside said mounting column so as to project thereinto for a distance less than half the length of the mounting column, said fixing rods terminating in stopper portions at the projecting ends thereof such that said stopper portions oppose each other spaced by a predetermined distance within said mounting column, a spring seat being defined at an end face of each of the stopper portions a coil spring being fixed between the opposed stopper portions of the upper and lower fixing rods so as to resiliently connect the upper and lower fixing rods.

45. A system as set forth in claim 44, wherein said lost motion absorbing means further comprises a narrow elongate opening in the longitudinal direction of the mounting column which overlaps the regions of the central interior portions of the mounting column occupied by the upper and lower stopper portions of the upper and lower fixing rods, said stopper portions further including a threaded shaft, projecting from each stopper portion such that the threaded shaft extends through the elongate opening to project from the surface of the mounting column and a knob with a threaded opening defined therein is attached to each threaded shaft by rotation such that a surface of the mounting column on either side of the stopper portions and said knob is held according to tightening of said know on said threaded shaft, thus fixing a position of the fixing rods relative the mounting column and a position of guide shoes of the fixing rod relative the interior of the hollow mounting pegs of upper and lower movable units and according to a tightened position of the knobs along said elongate opening, fixing a degree of compression or expansion of said spring so as to adjust a sensitivity of said lost motion absorbing means.

46. A system as set forth in claim 45, wherein said stopper portion further comprises a spacer arranged at a base portion of the threaded shaft where the threaded shaft projects from the stopper portion.

47. A system as set forth in claim 46, wherein said spacer is a rubber washer.

48. A system as set forth in claim 6, wherein said transmission means comprises a main sprocket for accepting an input rotational motive power, upper and lower drive sprockets rotatably mounted on threaded drive shafts for turning the threaded drive shafts according to rotation thereof, and a ladder chain for interconnecting said main and drive sprockets.

49. A system as set forth in claim 48, further including upper and lower guide sprockets for applying tensioning to said ladder chain which interconnects the sprockets for transmitting the rotational input motive power.

50. A system as set forth in claim 6, wherein said transmission means comprises a main pulley for accepting an input rotational motive power, upper and lower drive pulleys rotatably mounted on threaded drive shafts for turning the threaded drive shafts according to rotation thereof, and a belt for interconnecting said main and drive pulleys.

51. A system as set forth in claim 50, further including upper and lower guide pulleys for applying tensioning to said belt which interconnects the pulleys for transmitting the rotational input motive power.

52. A system as set forth in claim 6, wherein the accommodating width adjustment means comprises a movable block having two parallel guide openings a defined therethrough in a transverse direction and a threaded drive opening defined therethrough, parallel to and between the guide openings, the movable block having a plurality of mounting pegs projecting from a surface thereof in the direction of said movable side wall portion for engaging with mounting holes formed in edge surfaces of the movable side wall portion.

53. A system as set forth in claim 52, wherein said mounting pegs engage with a mounting column attached to the movable side wall portion.

54. A system as set forth in claim 52, wherein said movable block is further provided pipe portions fitted through said guide openings such that said guide shafts are guided substantially smoothly through said guide openings.

55. A system as set forth in claim 52, wherein the accommodating width adjustment means is provided on top and bottom sides of the magazine rack.

56. A system as set forth in claim 52, wherein said accommodating width adjustment means is provided only at a top or bottom portion of the magazine rack, the opposite side being equipped with guide shafts only.

57. A system as set forth in claim 55, wherein each of said top and bottom accommodating width adjustment means are comprised of a plurality of guide rails each of the guide rails being substantially C-shaped in cross section and having movable units mounted on said drive shafts passing within said C-shaped guide rails are formed with a semicircular cross-section such that the main body of the movable unit is mounted entirely within the C-shaped guide rail.

58. A system as set forth in claim 57, wherein an open portion of the C-shaped guide rails is covered with a protective sheet having a slit therethrough for permitting a mounting peg a of a movable unit to project therethrough.

59. A system as set forth in claim 58, wherein said protective sheet is made of felt.

60. A system as set forth in claim 58, wherein said protective sheet is made of rubber.

61. A system as set forth in claim 55, wherein said movable unit is of circular cross-section which partially projects from the open side of the C-shaped guide rail edges bordering an open side of the C-shaped guide rail engaging depressions formed in each side of the circular cross-section of said movable unit.

62. A system as set forth in claim 6, wherein said transmission means comprises a main sprocket capable of receiving and input rotational motive power, left and right upper guide sprockets left and right lower guide sprockets left and right lower drive sprockets and left and right upper drive sprockets, each of the drive upper and lower drive sprockets and are mounted on drive shafts respectively, and a ladder chain interconnecting the sprockets for turning the drive shafts in accordance with rotation of said main sprocket the transmission means driving two upper and two lower drive shafts concurrently.

63. A system as set forth in claim 6, wherein said transmission means comprises a main pulley capable of receiving and input rotational motive power, left and right upper guide pulleys left and right lower guide pulleys left and right lower drive pulleys and left and right upper drive pulleys, each of the drive upper and lower drive pulleys and are mounted on drive shafts respectively, and a belt interconnecting the pulleys for turning the drive shafts in accordance with rotation of said main pulley the transmission means driving two upper and two lower drive shafts concurrently.

64. A system as set forth in claim 52, wherein, the accommodating width adjustment means is provided only on a top or bottom portion of the magazine rack, only guide rails being installed on a side opposite the side having the accommodating width adjustment means.

65. A system as set forth in claim 13, portions of top and/or bottom portions of the magazine rack may be provided with a number of openings therethrough such that an overall weight of the magazine rack is reduced.

66. A system as set forth in claim 62, wherein bottom drive sprockets only are attached to drive shafts.

67. A system as set forth in claim 63, wherein bottom drive pulleys only are attached to drive shafts.

68. A system as set forth in claim 7, wherein the lateral positional adjustment mechanism including alignment mechanism is integrated with the driving control unit to move therewith for effecting positioning adjustment and alignment with engagement of the driving control unit with the transmission means of the magazine rack for adjustment under control of the arithmetic unit said operations being carried out at a single predetermined position on the conveyer.

69. A system as set forth in claim 68, wherein a facing direction of the magazine rack is in the forward or rearward direction of the conveyer.

70. A system as set forth in claim 7, wherein the lateral positional adjustment mechanism including alignment mechanism effects lateral positioning adjustment and alignment of the magazine rack on the conveyer when the magazine rack is faced toward the lateral positional adjustment mechanism said driving control unit is controlled from the opposite side of the magazine rack to effect adjustment of an accommodating width of the magazine rack.

71. A system as set forth in claim 70, wherein said adjustment of an accommodating width is effected according to a present accommodating width detected by a measuring unit provided at the base of the lateral positional adjustment mechanism.

72. A system as set forth in claim 70, wherein operation of the lateral positional adjustment mechanism, said alignment mechanism and said driving control unit are controlled by an arithmetic unit.

73. A system as set forth in claim 7, wherein the lateral positional adjustment mechanism provided with the alignment mechanism effects lateral positional adjustment and alignment at a beginning of the conveyer said driving control unit being provided at an end of the conveyer for adjusting an accommodating width of a plurality of magazine racks as same are introduced onto the conveyer.

74. A system as set forth in claim 73, wherein the facing direction of the magazine rack may be to the left or right of the conveyer direction.

75. A system as set forth in claim 73, further including a measuring unit, an arithmetic control unit controlling said lateral positional adjustment mechanism, said alignment mechanism and said driving control unit operations, said accommodating width adjustment being effected according to a present accommodating width detected by the measuring unit.

76. A magazine rack and positional adjustment system therefor, comprising:

an essentially box-shaped magazine rack having opposing side wall portions, a base portion and accommodating portions arranged at the inner side of the wall portions, said magazine rack additionally including, on at least two corners thereof, with support columns which are set at opposing corners on one side of the magazine rack such that front and rear faces of the support columns are defined at outer sides of at least two corners of the base portion of the magazine rack and accommodating width adjustment means comprising a movable unit provided at said base portion of said magazine rack, one of said side wall portions being movably mounted on said movable unit and transmission means for receiving an input rotation motive power in a one point manner and transmitting said input rotational motive power to a said movable unit of said accommodating width adjustment means;

a conveyer upon which said magazine rack is carried said conveyer including an alignment rail on a side thereof proximate said lateral positional adjustment mechanism and at least in the vicinity of said lateral positional adjustment mechanism;

a lateral positional adjustment mechanism including at least a pair of arm members, a space between said arm members being substantially equal to a width of said magazine rack, said arm members having plane surface portions on facing surfaces thereof and outwardly curved portions at distal ends thereof, said lateral positional adjustment mechanism being additionally provided on each arm thereof, with a conveyer alignment direction adjustment mechanism comprising a support column presser mounted on a pivot shaft and presser driving means therefore; and drive means drivable of said lateral positional adjustment mechanism in a direction toward said conveyer such that corners of the magazine rack, stopped by said conveyer at a predetermined position in front of said lateral positional adjustment mechanism, closest to the arm members contact said outwardly curved portions of said distal ends of said arm members, said drive means driving said arm members further in the direction of said conveyer until opposites sides of said magazine rack contact said plane surface portions of said arm members, then said presser driving means being actuated thereby rotating the support column pressers inwardly so as to contact a rear face of the support columns, pushing the magazine rack such that the front faces of the support columns are pressed flush against an inner face the aligning rail of the conveyer suitably aligning the magazine rack on the conveyer the lateral positional adjustment mechanism then being operable in a reverse operation such that the support column pressers are retracted from contact with the support columns of the magazine rack and the arms are retracted away from the conveyer holding the magazine rack returned to an initial state so as to be ready to perform adjustment and alignment operations for a subsequent next magazine rack on the conveyer.

77. A system as set forth in claim 76, wherein adjustment of said accommodating width via said accommodating width adjustment means is effected automatically via a driving control unit, said driving control unit comprising;
    an adjustment motor operable to drive said driving control unit toward said magazine rack when said magazine rack is stationary at a predetermined position on said conveyer;
    a drive motor, fixed to an upper portion of said driving control unit and having an output shaft thereof adapted so as to engage said transmission means an operable to apply rotational motive power to said transmission means for driving said accommodating width adjustment means, moving said movable side portion of said magazine rack to establish a selected accommodating width thereof, said adjustment motor further operable to move said driving control unit in a direction away from said magazine rack so as to disengage said output shaft of said drive motor from said transmission means of said magazine rack after accommodating width adjustment is complete.

78. A system as set forth in claim 77, wherein a set accommodating width of a magazine rack may be detected via a measuring unit, said measuring unit comprising;
    a movable unit mounted on a drive shaft for movement according to rotation of said drive shaft;
    a guide rail for guiding movement of said movable unit;
    drive means having an output shaft engaging said drive shaft for rotating said drive shaft;
    optical sensing means mounted on said movable unit, emitting a light beam therefrom in the direction of said drive means, said optical sensing means detective of a position of a movable side portion of a magazine rack, and operative to become OFF upon detection of said movable side portion of said magazine rack;
    an arithmetic unit;
    a slit plate mounted coaxially with the output shaft of said drive means, said light beam of said optical sensing means passing through slits formed in the slit plate while the slit plate rotates, data representative of the rotation of the slit plate being transmitted to the arithmetic unit in the form of pulse signals, said arithmetic unit calculating the traveling distance of the movable unit on the basis of the number of pulse signals received from the start of motion of said movable unit until switching off of said optical sensor.

79. A system as set forth in claim 78, wherein said driving control unit is controlled by said arithmetic unit dependent upon an accommodating width detected by said measuring unit.

80. A system as set forth in claim 77, wherein the lateral positional adjustment mechanism including alignment mechanism is integrated with the driving control unit to move therewith for effecting positioning adjustment and alignment with engagement of the driving control unit with the transmission means of the magazine rack for adjustment under control of the arithmetic unit said operations being carried out at a single predetermined position on the conveyer.

81. A system as set forth in claim 80, wherein a facing direction of the magazine rack is in the forward or rearward direction of the conveyer.

82. A system as set forth in claim 77, wherein the lateral positional adjustment mechanism including alignment mechanism effects lateral positioning adjustment and alignment of the magazine rack on the conveyer when the magazine rack is faced toward the lateral positional adjustment mechanism said driving control unit is controlled from the opposite side of the magazine rack to effect adjustment of an accommodating width of the magazine rack.

83. A system as set forth in claim 76, wherein said adjustment of an accommodating width is effected according to a present accommodating width detected by a measuring unit provided at the base of the lateral positional adjustment mechanism.

84. A system as set forth in claim 77, wherein operation of the lateral positional adjustment mechanism, said alignment mechanism and said driving control unit are controlled by the arithmetic unit.

85. A system as set forth in claim 77, wherein the lateral positional adjustment mechanism provided with the alignment mechanism effects lateral positional adjustment and alignment at a beginning of the conveyer said driving control unit being provided at an end of the conveyer for adjusting an accommodating width of the magazine racks as same is introduced onto the conveyer.

86. A system as set forth in claim 85, wherein the facing direction of the magazine rack may be to the left or right of the conveyer direction.

87. A system as set forth in claim 85, further including a measuring unit, the arithmetic control unit controlling said lateral positional adjustment mechanism, said alignment mechanism and said driving control unit operations, said accommodating width adjustment being effected according to a present accommodating width detected by the measuring unit.

* * * * *